(12) United States Patent
Sonoda et al.

(10) Patent No.: US 8,673,077 B2
(45) Date of Patent: Mar. 18, 2014

(54) VAPOR DEPOSITION DEVICE, VAPOR DEPOSITION METHOD, AND ORGANIC EL DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 13/984,283

(22) PCT Filed: Mar. 2, 2012

(86) PCT No.: PCT/JP2012/055358
§ 371 (c)(1),
(2), (4) Date: Aug. 7, 2013

(87) PCT Pub. No.: WO2012/121139
PCT Pub. Date: Sep. 13, 2012

(65) Prior Publication Data
US 2013/0323881 A1 Dec. 5, 2013

(30) Foreign Application Priority Data

Mar. 10, 2011 (JP) ................................. 2011-053078

(51) Int. Cl.
*C23C 16/00* (2006.01)
*H01L 21/31* (2006.01)

(52) U.S. Cl.
USPC .......................................... 118/716; 438/758

(58) Field of Classification Search
USPC .......... 118/715, 716, 720; 438/641, 680, 758; 257/E21.269, E21.274
See application file for complete search history.

(56) References Cited

U.S. PATENT DOCUMENTS

| 5,742,129 | A | 4/1998 | Nagayama et al. |
| 6,294,892 | B1 | 9/2001 | Utsugi et al. |
| 2004/0115338 | A1 | 6/2004 | Yoneda |
| 2007/0178708 | A1* | 8/2007 | Ukigaya ..................... 438/758 |
| 2010/0297349 | A1* | 11/2010 | Lee et al. .................. 427/248.1 |

FOREIGN PATENT DOCUMENTS

| JP | 8-227276 A | 9/1996 |
| JP | 2000-188179 A | 7/2000 |
| JP | 2004-103269 A | 4/2004 |
| JP | 2004-349101 A | 12/2004 |
| JP | 2005-281773 A | 10/2005 |
| JP | 2007-227359 A | 9/2007 |
| JP | 2010-270396 A | 12/2010 |

OTHER PUBLICATIONS

International Search Report received for PCT Patent Application No. PCT/JP2012/055358, mailed on May 22, 2012, 5 pages (2 pages of English Translation and 3 pages of ISR).

* cited by examiner

*Primary Examiner* — Selim Ahmed
(74) *Attorney, Agent, or Firm* — Morrison & Foerster LLP

(57) ABSTRACT

Vapor deposition particles (91) discharged from at least one vapor deposition source opening (61) pass through a plurality of limiting openings (82) of a limiting unit (80) and a plurality of mask openings (71) of a vapor deposition mask (70), and adhere to a substrate (10) that relatively moves along a second direction (10a) so as to form a coating film. The limiting unit includes a plurality of plate members stacked on one another. Accordingly, it is possible to efficiently form a vapor deposition coating film in which edge blurring is suppressed on a large-sized substrate at a low cost.

13 Claims, 27 Drawing Sheets

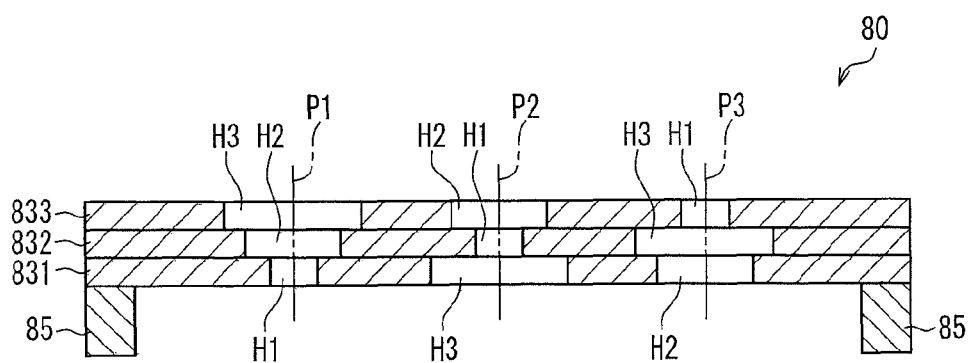
FIG. 15
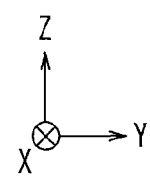

VAPOR DEPOSITION DEVICE, VAPOR DEPOSITION METHOD, AND ORGANIC EL DISPLAY DEVICE

CROSS REFERENCE TO RELATED APPLICATIONS

This is a U.S. National Phase patent application of PCT/JP2012/055358, filed Mar. 2, 2012, which claims priority to Japanese patent application no. 2011-053078 filed Mar. 10, 2011, each of which is hereby incorporated by reference in the present disclosure in its entirety.

TECHNICAL FIELD

The present invention relates to a vapor deposition device and a vapor deposition method for forming a coating film having a predetermined pattern on a substrate. The present invention also relates to an organic EL (Electro Luminescence) display device including an organic EL element including a light emitting layer formed by vapor deposition.

BACKGROUND ART

In recent years, flat panel displays are used in various commodity products and fields, and thus flat panel displays are required to have a large size, high image quality and low power consumption.

Under the circumstances, organic EL display devices, which include an organic EL element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a light emitting layer are stacked between a pair of electrodes. The TFT is connected to one of the pair of electrodes. Then, voltage is applied across the pair of electrodes so as to cause the light emitting layer to emit light, whereby an image is displayed.

In a full-color organic EL display device, generally, organic EL elements including light emitting layers of respective colors of red (R), green (G) and blue (B) are formed and arranged on a substrate as sub-pixels. By causing these organic EL elements to selectively emit light at the desired brightness by using the TFT, a color image is displayed.

In order to manufacture an organic EL display device, it is necessary to form a light emitting layer made of organic light emitting materials that emit respective colors in a predetermined pattern for each organic EL element.

Known methods for forming light emitting layers in a predetermined pattern are vacuum vapor deposition method, inkjet method and laser transfer method. For example, the vacuum vapor deposition method is often used for low molecular organic EL display devices (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of a coating film is formed. Vapor deposition is performed for each color of the light emitting layer, which is referred to as "vapor deposition by color".

For example, Patent Documents 1 and 2 describe a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

With conventional methods for performing vapor deposition by color as described above, as the substrate becomes larger, the mask needs to be large accordingly. However, when the mask is made large, a gap is likely to appear between the substrate and the mask by the mask being bent or being extended by its own weight. In addition, the size of the gap varies depending on the position of the deposition surface of the substrate. For this reason, it is difficult to perform highly accurate patterning, and it is therefore difficult to achieve high definition due to the occurrence of vapor deposition positions being positionally offset and the occurrence of color mixing.

Also, when the mask is made large, the mask as well as a frame or the like for holding the mask need to be gigantic, which increases the weight and makes handling thereof difficult. As a result, there is a possibility that productivity and safety might be compromised. Also, the vapor deposition device and devices that are used together therewith need to be made gigantic and complex as well, which makes device designing difficult and increases the installation cost.

For the reasons described above, the conventional methods for vapor deposition by color that are described in Patent Documents 1 and 2 are difficult to adapt to large-sized substrates, and it is difficult to perform vapor deposition by color on large-sized substrates such as those having a size exceeding 60 inches on a mass manufacturing level.

Patent Document 3 describes a vapor deposition method for causing vapor deposition particles discharged from a vapor deposition source to adhere to a substrate after causing the vapor deposition particles to pass through a mask opening of a vapor deposition mask while relatively moving the vapor deposition source and the vapor deposition mask with respect to the substrate. With this vapor deposition method, even in the case of large-sized substrates, it is not necessary to increase the size of the vapor deposition mask in accordance with the size of the substrates.

Patent Document 4 describes that a columnar-shaped or rectangle columnar-shaped vapor deposition beam direction adjustment plate having vapor deposition beam-pass-through holes formed therein whose diameter is approximately 0.1 mm to 1 mm is disposed between a vapor deposition source and a vapor deposition mask. By causing the vapor deposition particles discharged from the vapor deposition beam emission hole of the vapor deposition source to pass through the vapor deposition beam-pass-through holes formed in the vapor deposition beam direction adjustment plate, the directionality of vapor deposition beam can be increased.

CITATION LIST

Patent Document

Patent Document 1: JP H8-227276A
Patent Document 2: JP 2000-188179A
Patent Document 3: JP 2004-349101A
Patent Document 4: JP 2004-103269A

DISCLOSURE OF INVENTION

Problem to be Solved by the Invention

According to the vapor deposition method described in Patent Document 3, a vapor deposition mask smaller than the substrate can be used, and therefore vapor deposition can be easily performed on large-sized substrates.

However, because it is necessary to relatively move the vapor deposition mask with respect to the substrate, the substrate and the vapor deposition mask need to be spaced apart from each other. With Patent Document 3, vapor deposition particles that fly from various directions may enter the mask openings of the vapor deposition mask, and therefore the width of the coating film formed on the substrate is longer than the width of the mask opening, resulting blurring at the edge of the coating film.

Patent Document 4 describes that the directionality of the vapor deposition beam entering the vapor deposition mask is improved by the vapor deposition beam direction adjustment plate.

However, in the actual vapor deposition step, the vapor deposition particles (that is, the vapor deposition material) discharged from the vapor deposition source adhere to the vapor deposition beam direction adjustment plate. If the amount of the vapor deposition material that has adhered to the vapor deposition beam direction adjustment plate increases, the vapor deposition material eventually comes off the vapor deposition beam direction adjustment plate and falls. If the vapor deposition material falls on the vapor deposition source, the vapor deposition material is re-vaporized and adheres to the substrate at an undesired position, as a result of which the yield may decrease. Also, if the vapor deposition material falls on and blocks the vapor deposition beam emission hole of the vapor deposition source, a vapor deposition film is not formed at a desired position of the substrate, and the yield may also decrease.

In order to avoid this, it is necessary to replace the vapor deposition beam direction adjustment plate to which the vapor deposition material has adhered with a new one. There is a problem in that in order to replace a large-sized and heavyweight vapor deposition beam direction adjustment plate while maintaining a vacuum atmosphere, large-sized equipment for replacement is required, and the vapor deposition cost increases. On the other hand, if a vacuum chamber is opened and a vacuum atmosphere is disrupted to replace the vapor deposition beam direction adjustment plate, there is a problem in that much labor and time are required, as a result of which the throughput at the time of mass production decreases.

It is an object of the present invention to efficiently form a vapor deposition coating film in which edge blurring is suppressed on a large-sized substrate at a low cost.

Means for Solving Problem

The vapor deposition device of the present invention is a vapor deposition device that forms a coating film having a predetermined pattern on a substrate, and the vapor deposition device includes a vapor deposition unit including a vapor deposition source having at least one vapor deposition source opening, a vapor deposition mask disposed between the at least one vapor deposition source opening and the substrate, and a limiting unit that is disposed between the at least one vapor deposition source opening and the vapor deposition mask and in which a plurality of limiting portions are disposed along a first direction that is orthogonal to a normal line direction of the substrate, and a moving mechanism that moves one of the substrate and the vapor deposition unit relative to the other along a second direction that is orthogonal to the normal line direction of the substrate and the first direction, in a state in which the substrate and the vapor deposition mask are spaced apart at a fixed spacing. The vapor deposition device forms the coating film by causing vapor deposition particles discharged from the at least one vapor deposition source opening and passing through a plurality of limiting openings separated by the plurality of limiting portions and a plurality of mask openings formed in the vapor deposition mask to adhere onto the substrate. The limiting unit includes a plurality of plate members that are stacked on one another.

The vapor deposition method of the present invention is a vapor deposition method including a vapor deposition step of forming a coating film having a predetermined pattern on a substrate by causing vapor deposition particles to adhere onto the substrate, and the vapor deposition step is performed by using the vapor deposition device.

An organic EL display device according to the present invention includes a coating film formed by using the above vapor deposition method of the present invention as a light emitting layer.

Effects of the Invention

According to the vapor deposition device and the vapor deposition method of the present invention, vapor deposition particles that have passed through mask openings formed in the vapor deposition mask are caused to adhere onto a substrate while one of the substrate and a vapor deposition unit is moved relative to the other, and therefore a vapor deposition mask that is smaller than the substrate can be used. Therefore, it is possible to form a coating film on a large-sized substrate by vapor deposition.

A plurality of limiting portions that separate a plurality of limiting openings selectively capture the vapor deposition particles entering the limiting openings according to the incidence angles thereof, and therefore only vapor deposition particles having a predetermined incidence angle or less can enter the mask openings. Accordingly, the maximum incidence angle of the vapor deposition particles with respect to the substrate is reduced, and therefore blurring that occurs at the edge of the coating film formed on the substrate can be suppressed.

The limiting unit is constituted by a plurality of plate members, and therefore only a plate member to which the vapor deposition material has adhered needs only to be replaced. In other words, it is not necessary to replace the entire limiting unit to which the vapor deposition material has adhered. Therefore, a device for replacement can be simplified, and therefore the cost in the vapor deposition device can be reduced. Also, a period of time required for replacement can be shortened, and therefore a drop in the throughput of the device resulting from the replacement can be reduced. Therefore, vapor deposition can be efficiently performed at a low cost.

An organic EL display device of the present invention includes a light emitting layer formed by using the above-described vapor deposition method, and therefore the light emitting layer in which edge blurring is suppressed can be inexpensively formed. Therefore, it is possible to provide an inexpensive organic EL display device that has excellent reliability and display quality and has a large size.

BRIEF DESCRIPTION OF DRAWINGS

FIG. 15 is a cross-sectional view of the limiting unit in the vapor deposition device according to Embodiment 3 of the present invention, along a plane parallel to the movement direction of the substrate.

DESCRIPTION OF THE INVENTION

Figure 1:
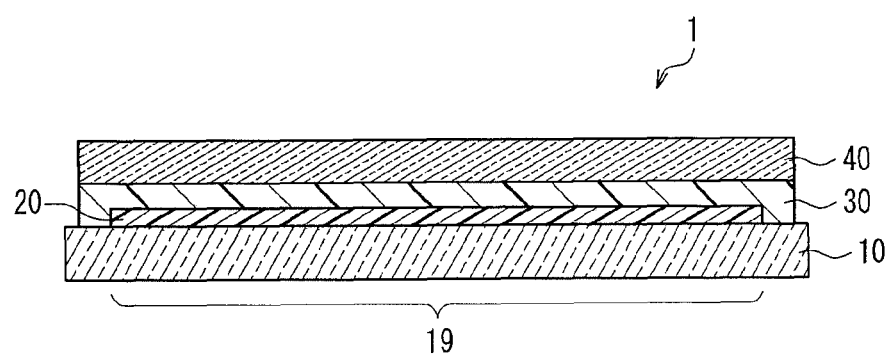
FIG. 1 is a cross-sectional view showing a schematic configuration of an organic EL display device.

The vapor deposition device of the present invention is a vapor deposition device that forms a coating film having a predetermined pattern on a substrate, and the vapor deposition device includes a vapor deposition unit including a vapor deposition source having at least one vapor deposition source opening, a vapor deposition mask disposed between the at least one vapor deposition source opening and the substrate, and a limiting unit that is disposed between the at least one vapor deposition source opening and the vapor deposition mask and in which a plurality of limiting portions are disposed along a first direction that is orthogonal to a normal line direction of the substrate, and a moving mechanism that moves one of the substrate and the vapor deposition unit relative to the other along a second direction that is orthogonal to the normal line direction of the substrate and the first direction, in a state in which the substrate and the vapor deposition mask are spaced apart at a fixed spacing. The vapor deposition device forms the coating film by causing vapor deposition particles discharged from the at least one vapor deposition source opening and passing through a plurality of limiting openings separated by the plurality of limiting portions and a plurality of mask openings formed in the vapor deposition mask to adhere onto the substrate. The limiting unit includes a plurality of plate members that are stacked on one another.

It is preferable that at least a plurality of the limiting portions of the limiting unit include a plurality of plate members stacked on one another.

In the vapor deposition device of the present invention, it is preferable that the plurality of plate members are stacked in the normal line direction of the substrate. In this case, it is preferable that a plurality of through holes constituting the plurality of limiting openings are formed in each of the plurality of plate members. Accordingly, when the vapor deposition material has adhered to the limiting unit, it is possible to remove only a plate member to which the largest amount of the vapor deposition material has adhered and that is located nearest to the vapor deposition source. As a result, it is possible to easily perform maintenance of the limiting unit in a short time.

In the above description, it is preferable that the vapor deposition method of the present invention further includes a step of removing a plate member that is located nearest to the vapor deposition source among the plurality of plate members and to which the vapor deposition particles have adhered, and a step of adding a clean plate member to the limiting unit at a different position from the position of the removed plate member. The plate member to which the vapor deposition material has adhered is removed from the limiting unit, and a clean plate member is added instead of the removed plate member, and therefore, it is possible to easily perform maintenance of the limiting unit in a short time while maintaining the function of the limiting unit. Also, the clean plate member is added to a different position from the position of the plate member to which the vapor deposition material has adhered, and therefore it is possible to lengthen a period during which each of the plurality of plate members is used in the limiting unit to when the vapor deposition material adheres thereto and said plate member is removed.

Note that in the present invention, "clean" refers that the vapor deposition material has not adhered.

In the above description, it is preferable that a clean plate member is stacked on the surface of the plate member that is located nearest to the vapor deposition mask among the plurality of plate members on the side of the vapor deposition mask. Accordingly, it is possible to make a period during which each of the plurality of plate members is used in the limiting unit substantially the same for all of the plate members constituting the limiting unit.

Alternatively, the vapor deposition method of the present invention may further includes a step of removing a plate member that is located nearest to the vapor deposition source among the plurality of plate members and of which the vapor deposition particles have adhered to only one side surface, turning over the plate member, and adding the plate member to the limiting unit at a different position from the position of the removed plate member. In other words, in the case where the vapor deposition material has adhered to only one side surface of the plate member, the plate member is turned over and further used in the limiting unit, instead of removing said plate member. Therefore, the frequency at which a plate member is replaced can be reduced, and therefore the throughput of the device can be improved.

In the above description, it is preferable that the plate member of which the vapor deposition material has adhered to one side surface is stacked on the surface of the plate member that is located nearest to the vapor deposition mask among the plurality of plate members on the side of the vapor deposition mask. Accordingly, it is possible to make a period during which each of the plurality of plate members is used in the limiting unit substantially the same for all of the plate members constituting the limiting unit.

In the above description, it is preferable that the vapor deposition method of the present invention further includes a step of removing a plate member that is located nearest to the vapor deposition source among the plurality of plate members and of which the vapor deposition particles have adhered to both side surfaces, and a step of adding a clean plate member to the limiting unit at a different position from the position of the removed plate member. In other words, in the case where the vapor deposition material has adhered to both side surfaces of the plate member, said plate member is removed from the limiting unit, and a clean plate member is added instead of the removed plate member. Therefore, the frequency at which a plate member is replaced can be reduced, and therefore the throughput of the device can be improved. Also, the clean plate member is added to a different position from the position of the plate member of which the vapor deposition material has adhered to both side surfaces, and therefore it is possible to lengthen a period during which each of the plurality of plate members is used in the limiting unit to when the vapor deposition material adheres thereto and said plate member is removed.

In the above description, it is preferable that a clean plate member is stacked on the surface of the plate member that is located nearest to the vapor deposition mask among the plurality of plate members on the side of the vapor deposition mask. Accordingly, it is possible to make a period during which each of the plurality of plate members is used in the limiting unit substantially the same for all of the plate members constituting the limiting unit.

In the above-described vapor deposition device of the present invention, it is preferable that the plurality of through holes formed in each of the plurality of plate members include a plurality of types of through holes having different opening widths. In this case, it is preferable that the plurality of types of through holes having different opening widths are in communication in the normal line direction of the substrate to constitute the plurality of limiting openings. Accordingly, it is possible to form a limiting opening whose opening width changes along the normal line direction of the substrate.

In the above description, it is preferable that the opening widths of the plurality of types of through holes that are in communication in the normal line direction of the substrate increase from the vapor deposition source opening side to the vapor deposition mask side. Accordingly, even if the vapor deposition material that has adhered to the inner circumferential surface of the through hole of the plate member that is located near to the vapor deposition mask comes off in the case where the vapor deposition source is disposed below the substrate, it is possible to prevent the vapor deposition material from falling on the vapor deposition source.

In the above description, it is preferable that the vapor deposition device is configured such that the vapor deposition particles discharged from the vapor deposition source opening adhere to only an inner circumferential surface of the through hole that is located nearest to the vapor deposition source opening among inner circumferential surfaces of the plurality of types of through holes that are in communication in the normal line direction of the substrate. Accordingly, if the plate member that is located nearest to the vapor deposition source is removed, it is possible to obtain a limiting opening of which the vapor deposition material has not adhered to the inner circumferential surface.

In the above description, it is preferable that the plurality of types of through holes having different opening widths are disposed along a direction parallel to the second direction, in each of the plurality of plate members. Accordingly, even if the plate member to which the vapor deposition material has adhered is replaced (or moved), it is possible to form, at any position in the second direction, a limiting opening in which a plurality of types of through holes are in communication such that the opening width thereof increases from the vapor deposition source opening side to the vapor deposition mask side.

In the above description, it is preferable that the vapor deposition method of the present invention further includes a step of removing a plate member that is located nearest to the vapor deposition source among the plurality of plate members and to which the vapor deposition particles have adhered, and adding a plate member to the limiting unit at a different position from the position of the removed plate member, and a step of moving one of the vapor deposition source opening and the limiting unit relative to the other along the second direction. Accordingly, it is possible to always dispose, in front of the vapor deposition source opening, a limiting opening in which a plurality of types of through holes are in communication such that the opening width thereof increases from the vapor deposition source opening side to the vapor deposition mask side. In the above description, the plate member that is added to the limiting unit may be a clean plate member, and alternatively may be a plate member that is removed from a position that is located nearest to the vapor deposition source. In the latter case, the plate member that is added does not include the plate member of which the vapor deposition material has adhered to both side surfaces. It is preferable that the plate member that is added is stacked on the surface of the plate member that is located nearest to the vapor deposition mask among the plurality of plate members on the side of the vapor deposition mask.

In the above-described vapor deposition device of the present invention, it is preferable that a portion of the plurality of plate members are positionally offset with respect to another portion in a direction orthogonal to the normal line direction of the substrate such that unevenness is formed on the inner circumferential surfaces of the plurality of limiting openings. The size of an effective region of the limiting opening can be changed to an arbitrary size that is less than or equal to the size of the through hole formed in the plate member by adjusting the amount of positional offset appropriately. Also, the shape of the effective region of the limiting opening can be changed to an arbitrary shape by adjusting the direction of positional offset appropriately. Furthermore, unevenness is formed on the inner circumferential surface of the limiting opening, and therefore the vapor deposition material that comes off can be held inside a recessed portion thereof.

In the above description, the plurality of plate members may be positionally offset alternatively in opposite directions. Accordingly, regular unevenness is formed on the inner circumferential surface of the limiting opening, and therefore the unevenness is effective in holding the vapor deposition material that comes off.

In the above description, it is preferable that the vapor deposition method of the present invention further includes a step of positionally offsetting a portion of the plurality of plate members with respect to another portion in a direction orthogonal to the normal line direction of the substrate such that unevenness is formed on the inner circumferential surfaces of the plurality of limiting openings. The size of the effective region of the limiting opening can be changed to an arbitrary size that is less than or equal to the size of the through hole formed in the plate member by adjusting the amount of positional offset appropriately. Also, the shape of the effective region of the limiting opening can be changed to an arbitrary shape by adjusting the direction of positional offset appropriately. Furthermore, unevenness is formed on the inner circumferential surface of the limiting opening, and therefore the vapor deposition material that comes off can be held inside a recessed portion thereof.

In the above-described vapor deposition device of the present invention, the plurality of plate members may be stacked in the first direction. In this case, it is preferable that each of the plurality of limiting portions includes the plurality of plate members stacked in the first direction. Accordingly, it is possible to remove only plate members to which the largest amount of the vapor deposition material has adhered and that are both outermost layers among the plurality of plate members stacked in the first direction. As a result, it is possible to easily perform maintenance of the limiting unit in a short time.

In the above description, it is preferable that the vapor deposition method of the present invention further includes a step of removing a pair of plate members that are the outermost layers to which the vapor deposition particles have adhered among the plurality of plate members constituting each of the plurality of limiting portions, and a step of inserting a pair of plate members that are overlaid on each other between the plurality of plate members. The plate members to which the vapor deposition material has adhered are removed, and a pair of plate members are inserted between a plurality of remaining plate members, and therefore, it is possible to easily perform maintenance of the limiting unit in a short time while maintaining the function of the limiting unit. Also, the plate members are inserted at a position other than the position of the outermost layer, and therefore it is possible to lengthen a period during which each of the plurality of plate members is used in the limiting unit to when the vapor deposition material adheres thereto and said plate member is removed.

In the above description, the pair of the plate members that are inserted may be clean plate members, and alternatively may be plate members removed from the outermost layers. In the latter case, the plate members that are inserted do not include the plate members of which the vapor deposition material has adhered to both side surfaces. It is preferable that the pair of the plate member that are added are inserted at a central position of the plurality of plate members.

It is preferable that the coating film is a light emitting layer for an organic EL element, in the above-described vapor deposition method of the present invention.

Hereinafter, the present invention will be described in detail by showing preferred embodiments. It should be noted, however, that the present invention is not limited to the following embodiments. For the sake of convenience of the description, the drawings referred to hereinafter show only the principal members required to describe the present invention in simplified form among the constituent members of the embodiments of the present invention. Accordingly, the present invention may include optional constituent members that are not shown in the following drawings. Also, the dimensions of the members in the drawings do not faithfully represent the actual dimensions or dimensional proportions of the constituent members.

(Configuration of Organic EL Display Device)

An example of an organic EL display device that can be manufactured by applying the present invention will be described. This organic EL display device is a bottom emission type organic EL display device in which light is extracted from the TFT substrate side and that displays full color images by controlling light emission of red (R), green (G) and blue (B) pixels (sub-pixels).

First, the overall configuration of the organic EL display device will be described below.

Figure 2:
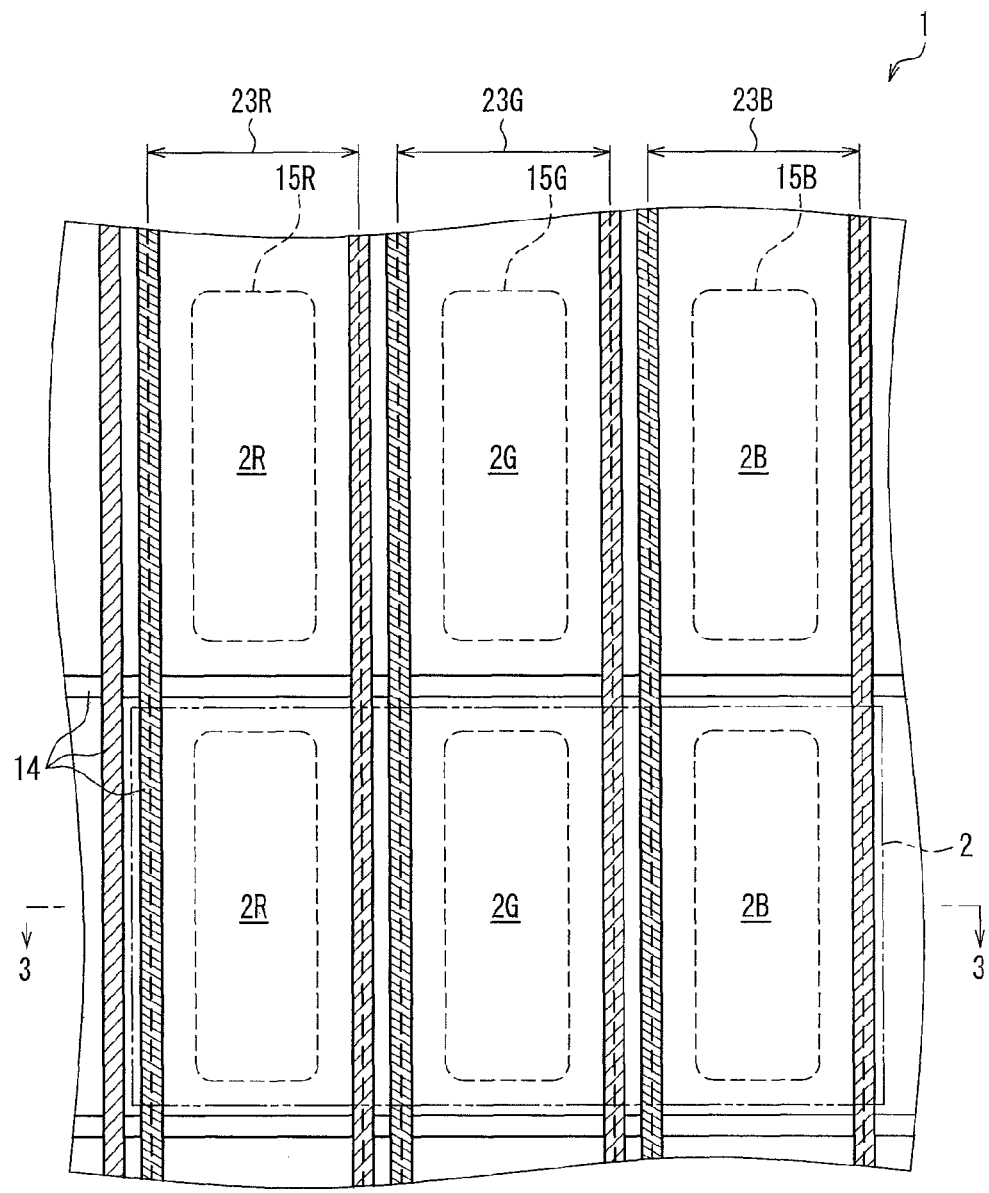
FIG. 2 is a plan view showing a configuration of pixels that constitute the organic EL display device shown in FIG. 1.
Figure 3:
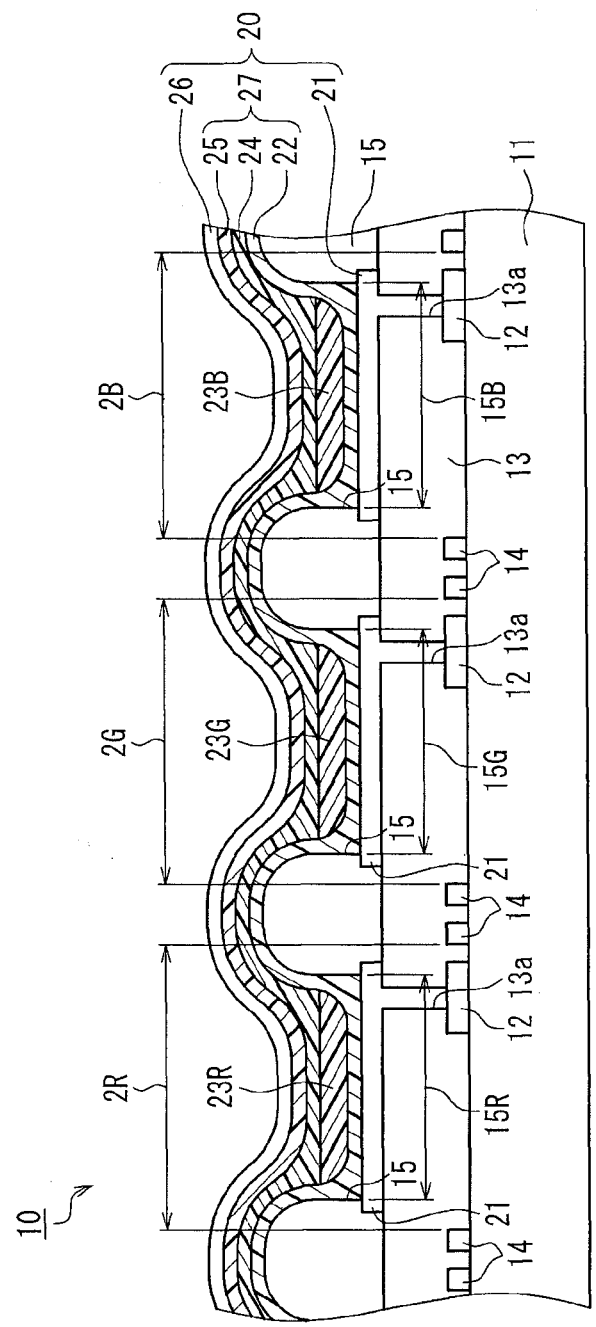
FIG. 3 is a cross-sectional view of a TFT substrate that constitutes the organic EL display device taken along the line 3-3 of FIG. 2.

FIG. 1 is a cross-sectional view showing a schematic configuration of the organic EL display device. FIG. 2 is a plan view showing a configuration of pixels that constitute the organic EL display device shown in FIG. 1. FIG. 3 is a cross-sectional view of a TFT substrate that constitutes the organic EL display device, taken along the line III-III of FIG. 2.

As shown in FIG. 1, the organic EL display device 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display device 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 stacked thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display device, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the vertical direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in their respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors.

The light emitting layers 23R, 23G and 23B are provided to extend in stripes in the column direction (up-down direction in FIG. 2).

A configuration of the TFT substrate 10 will be described.

As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is stacked over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes from the first electrode 21 into the organic EL layer 27. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the organic EL layer 27.

The electron injection layer 25 is a layer having a function of enhancing the efficiency of injecting electrons from the second electrode 26 to the light emitting layers 23R, 23G and 23B.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

(Manufacturing Method for Organic EL Display Device)

A method for manufacturing an organic EL display device 1 will be described below.

Figure 4:
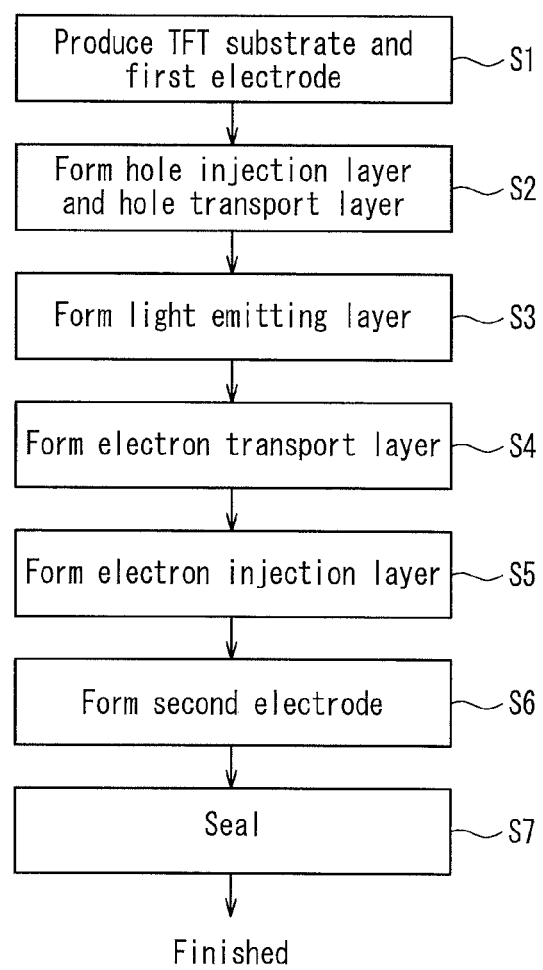
FIG. 4 is a flowchart illustrating the steps of a process for manufacturing an organic EL display device in order.

FIG. 4 is a flowchart illustrating the steps of a process for manufacturing the above-described organic EL display device 1 in order.

As shown in FIG. 4, the method for manufacturing an organic EL display device 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers stacked in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. As an example, a rectangular glass plate having a thickness of about 1 mm and longitudinal and transverse dimensions of 500×400 mm can be used as the insulating substrate 11.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Generally, polyimide resin is not transparent but colored. For this reason, when manufacturing a bottom emission type organic EL display device 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the inter-layer film 13 are formed.

Next, a first electrode 21 is formed on the inter-layer film 13. Specifically, a conductive film (electrode film) is formed on the inter-layer film 13. Next, a photoresist is applied onto the conductive film and patterning is performed by using a photolithography technique, after which the conductive film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials that can be used for the first electrode 21 include transparent conductive materials such as ITO (indium tin oxide), IZO (indium zinc oxide) and gallium-added zinc oxide (GZO); and metal materials such as gold (Au), nickel (Ni) and platinum (Pt).

As the method for laminating conductive films, it is possible to use a sputtering method, a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the edge cover 15. As an example, an edge cover 15 having a thickness of about 1 μm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, heterocyclic or linear conjugated monomers, oligomers or polymers, such as polysilane-based compounds, vinylcarbazole-based compounds, thiophene-based compounds, aniline-based compounds and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex, bis(benzoquinolinato) beryllium complex, tri(dibenzoylmethyl)phenanthroline europium complex, ditolyl vinyl biphenyl and the like.

The light emitting layers 23R, 23G and 23B may be constituted only by the above-described organic light emitting material, or may include a hole transport layer material, an electron transport layer material, additives (donor, acceptor, and the like), a luminescent dopant, and the like. Also, a configuration may be adopted in which these materials are dispersed in a polymeric material (resin for binding) or an inorganic material. It is preferable that luminescent dopants are dispersed in host from the view are tilted of improving light-emission efficiency and achieving a long service life.

The light emitting layers 23R, 23G and 23B can have a thickness of, for example, 10 to 100 nm.

The vapor deposition method and the deposition device of the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof, LiF (lithium fluoride) and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlVIg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display device 1 is obtained.

In the organic EL display device 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, step S3, which is the step of forming light emitting layers 23R, 23G and 23B by vapor deposition by color, will be described.

Embodiment 1

Figure 5:
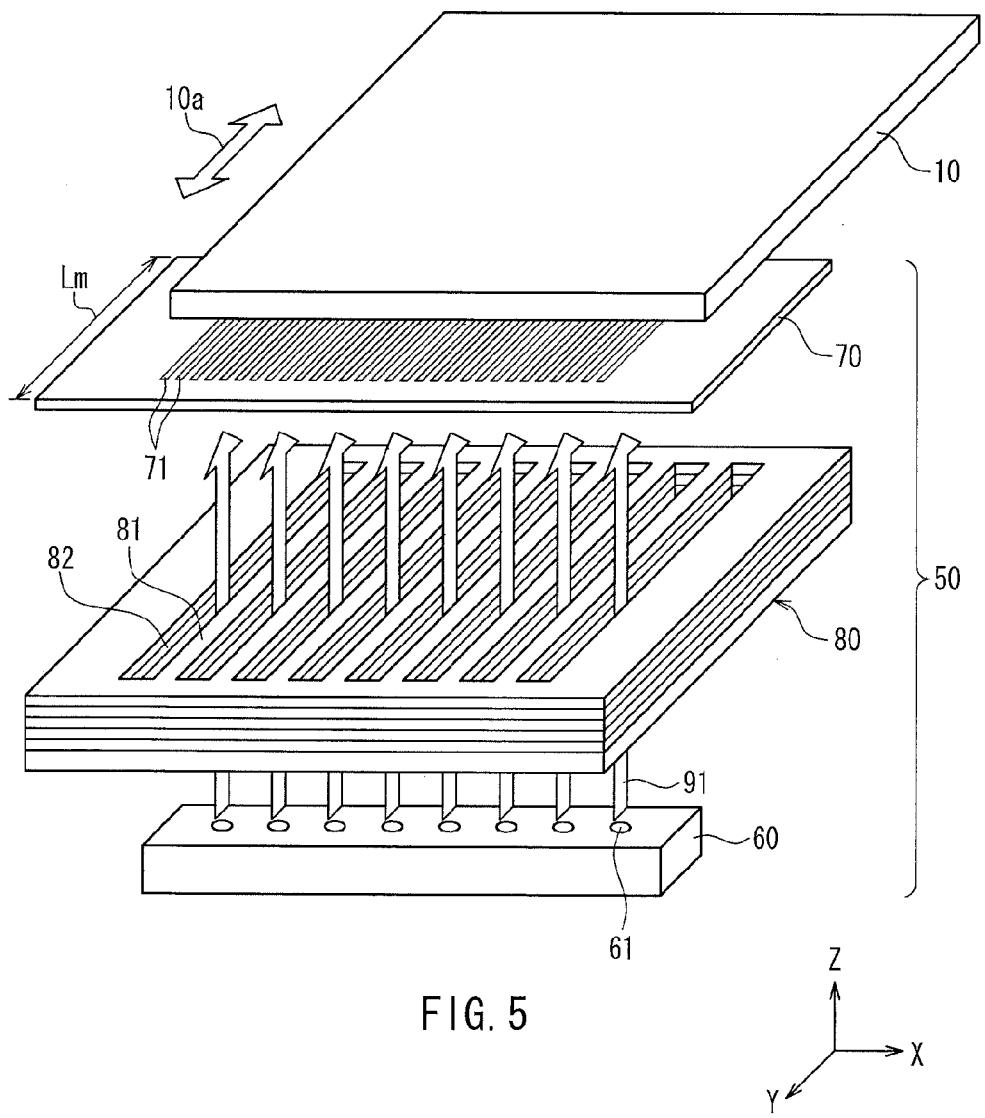
FIG. 5 is a perspective view showing the basic configuration of a vapor deposition device according to Embodiment 1 of the present invention.
Figure 6:
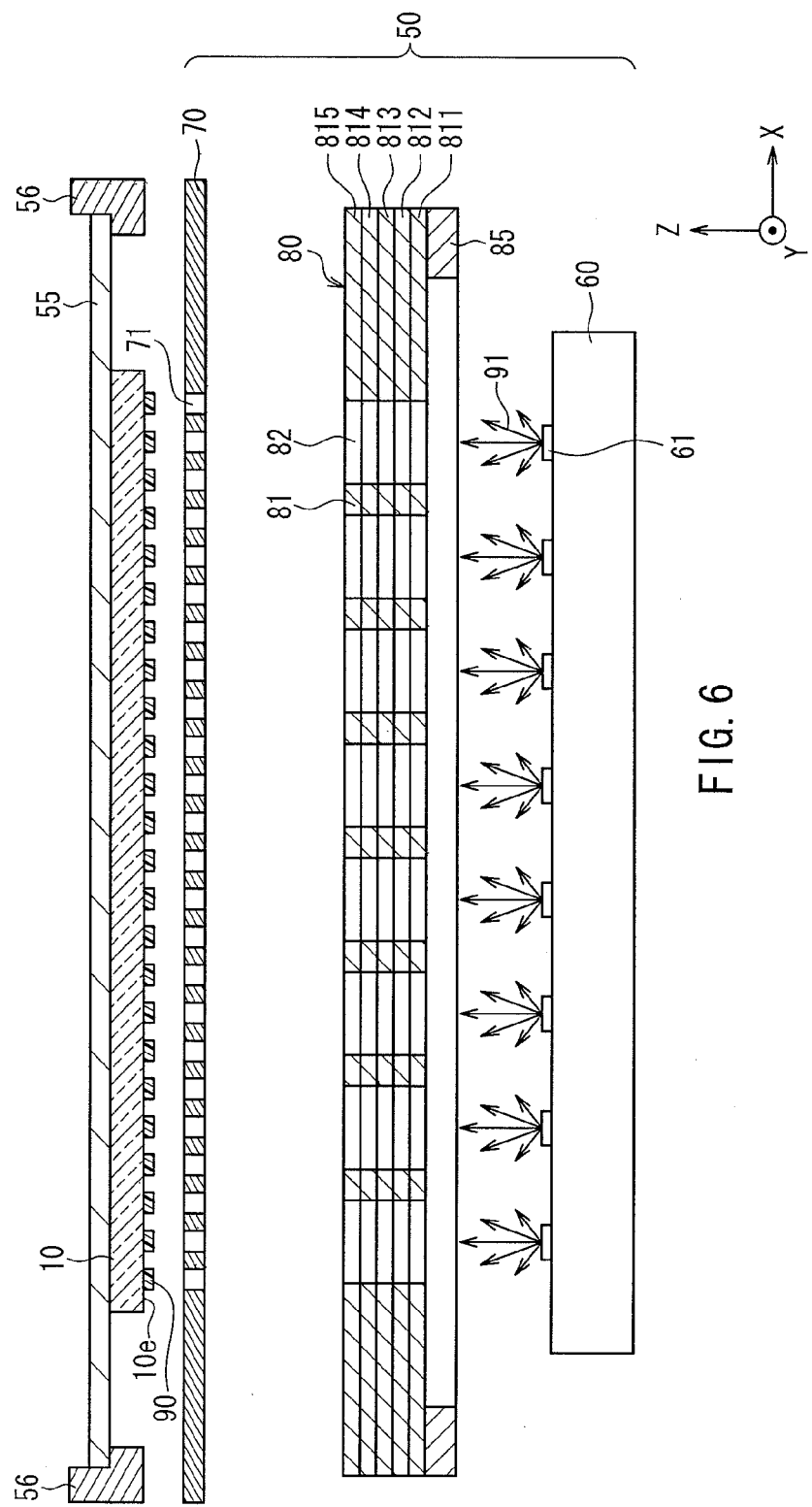
FIG. 6 is a front-cross sectional view of the vapor deposition device shown in FIG. 5, along a plane that is perpendicular to the traveling direction of the substrate and passes across vapor deposition source openings.

FIG. 5 is a perspective view showing the basic configuration of the vapor deposition device according to Embodiment 1 of the present invention. FIG. 6 is a front cross-sectional view of the vapor deposition device shown in FIG. 5, along a plane passing across a vapor deposition source 60.

A vapor deposition source 60, a vapor deposition mask 70, and a limiting unit 80 disposed therebetween constitute a vapor deposition unit 50. The substrate 10 moves along an arrow 10a at a constant speed with respect to the vapor deposition mask 70 on the opposite side from the vapor deposition source 60. For the sake of convenience of the description given below, an XYZ orthogonal coordinate system is set in which a horizontal axis parallel to the movement direction 10a of the substrate 10 is defined as the Y axis, a horizontal axis perpendicular to the Y axis is defined as the X axis, and a vertical axis perpendicular to the X axis and the Y axis is defined as the Z axis. The Z axis is parallel to the normal line direction of the deposition surface 10e of the substrate 10. To facilitate the description, the side to which the arrow indicating the Z axis are tilted (the upper side of FIG. 6) is referred to as the "upper side".

The vapor deposition source 60 has a plurality of vapor deposition source openings 61 in its upper surface (that is, the surface opposing the vapor deposition mask 70). The plurality of vapor deposition source openings 61 are arranged along a straight line parallel to the X axis direction (first direction) at a fixed pitch. Each of the vapor deposition source openings 61 has a nozzle shape that is upwardly open parallel to the Z axis, and discharges the vapor deposition particles 91 that are materials for the coating film 90.

The vapor deposition mask 70 is a plate-shaped piece that has a major surface (the surface having the largest area) parallel to the XY plane and in which a plurality of mask openings 71 are formed along the X axis direction at different positions in the X axis direction. The mask openings 71 are through holes that penetrate the vapor deposition mask 70 in the Z axis direction. In the present embodiment, each mask opening 71 has an opening shape having a slot shape that is parallel to the Y axis, but the present invention is not limited thereto. All of the mask openings 71 may have the same shape and dimensions, or may have different shapes and dimensions. The pitch in the X axis direction of the mask openings 71 may be constant or different.

It is preferable that the vapor deposition mask 70 is held by a mask tension mechanism (not shown). The mask tension mechanism prevents the occurrence of bending or extension of the vapor deposition mask 70 due to its own weight, by applying tension to the vapor deposition mask 70 in a direction parallel to the major surface thereof.

The limiting unit 80 is disposed between the vapor deposition source openings 61 and the vapor deposition mask 70.

A plurality of limiting openings 82 which are through holes that respectively penetrate the limiting unit 80 in the Z axis direction are formed in the limiting unit 80. The plurality of limiting openings 82 are arranged along the X axis direction at a fixed pitch. The limiting opening 82 neighboring in the X axis direction are separated by a limiting portion 81.

The limiting unit 80 includes five plate members 811 to 815 having the same shape and dimension that are stacked in the Z axis direction. A plurality of through holes having the same dimension are formed in each of the plate members 811 to 815 at the same positions. The through holes formed in each of the plate members 811 to 815 are in communication with one another by the plate members 811 to 815 being stacked so as to constitute the limiting openings 82 of the limiting unit 80. Five plate members 811 to 815 are placed on a supporting base 85. The supporting base 85 has a rectangular frame shape that is a substantially rectangular shape as viewed in the Z axis direction and supports the outer circumferential edges of the plate members 811 to 815. Note that the number of plate members constituting the limiting unit 80 is not limited to five, and the number may be larger or smaller than this.

The limiting unit 80 may include a cooling device for cooling the limiting unit 80 in order to prevent a vapor deposition material that has adhered thereto from re-vaporizing or the like. Although there is no particular limitation on a cooling device, for example, a pipe for allowing a coolant (for example, water) to pass through, a cooling element such as a Peltier element or the like can be arbitrarily selected.

In the present embodiment, one vapor deposition source opening 61 is disposed at the central point between limiting portions 81 neighboring in the X axis direction. Accordingly, one vapor deposition source opening 61 corresponds to one limiting opening 82. However, the present invention is not limited to this, and a plurality of limiting openings 82 may be configured so as to correspond to one vapor deposition source opening 61. Alternatively, one limiting opening 82 may be configured so as to correspond to a plurality of vapor deposition source openings 61. In the present invention, "a limiting opening 82 corresponding to a vapor deposition source opening 61" refers to a limiting opening 82 that is designed so that the vapor deposition particles 91 discharged from the vapor deposition source opening 61 are capable of passing therethrough.

Although the number of the vapor deposition source openings 61 and the limiting openings 82 is eight in FIGS. 5 and 6, the present invention is not limited to this and the number may be larger or smaller than this.

The vapor deposition source openings 61 are spaced apart from the limiting portions 81 in the Z axis direction, and the limiting portions 81 are spaced apart from the vapor deposition mask 70 in Z axis direction. It is preferable that the relative positions between the vapor deposition source 60, the limiting unit 80, and the vapor deposition mask 70 are substantially constant at least during vapor deposition by color.

The substrate 10 is held by a holding device 55. As the holding device 55, for example, an electrostatic chuck that holds the surface of the substrate 10 opposite to the deposition surface 10e of the substrate 10 with electrostatic force can be used. The substrate 10 can thereby be held substantially without the substrate 10 being bent by its own weight. However, the holding device 55 for holding the substrate 10 is not limited to an electrostatic chuck and may be any other device.

The substrate 10 held by the holding device 55 is scanned (moved) in the movement direction 10a parallel to the Y axis at a constant speed by a moving mechanism 56, on the opposite side from the vapor deposition source 60 with respect to the vapor deposition mask 70, with the substrate 10 being spaced apart from the vapor deposition mask 70 at a fixed spacing. The movement of the substrate 10 may be a reciprocal movement or a single direction movement in which the substrate 10 is moved in either direction. There is no particular limitation on the configuration of the moving mechanism 56. For example, any known transfer driving mechanism can be used such as a linear motor or a feed screw mechanism that rotates a feed screw by a motor.

The vapor deposition unit 50, the substrate 10, the holding device 55 for holding the substrate 10 and the moving mechanism 56 for moving the substrate 10 are housed in a vapor deposition chamber 100 (see FIG. 12 described later). The vapor deposition chamber is a hermetically sealed container, with the pressure in its internal space being reduced and maintained in a predetermined low pressure state.

The vapor deposition particles 91 discharged from the vapor deposition source openings 61 pass through the limiting openings 82 of the limiting unit 80 and the mask openings 71 of the vapor deposition mask 70 in this order. The vapor deposition particles 91 that have passed through the mask openings 71 adhere to the deposition surface (specifically, the surface of the substrate 10 opposing the vapor deposition mask 70) 10e of the substrate 10 traveling in the Y axis direction to form a coating film 90. The coating film 90 has a stripe shape extending in the Y axis direction.

The vapor deposition particles 91 that are to form the coating film 90 necessarily pass through the limiting opening 82 and the mask opening 71. The limiting unit 80 and the vapor deposition mask 70 are designed so as to prevent a situation in which the vapor deposition particles 91 discharged from the vapor deposition source openings 61 reach the deposition surface 10e of the substrate 10 without passing through the limiting openings 82 and the mask openings 71, and if necessary, a shielding plate (not shown) or the like that prevents flight of the vapor deposition particles 91 may be installed.

By performing vapor deposition three times by changing a material of the vapor deposition particles 91 for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

According to Embodiment 1, the substrate 10 moves along the movement direction 10a relative to the vapor deposition unit 50 including the vapor deposition mask 70, and thus a dimension Lm of the vapor deposition mask 70 in the movement direction 10a of the substrate 10 can be set irrespective of a dimension of the substrate 10 in the same direction. This enables the use of a vapor deposition mask 70 that is smaller than the substrate 10. Accordingly, even if the substrate 10 is made large, the vapor deposition mask 70 does not need to be made large, and therefore there is little possibility of the occurrence of a problem in that the vapor deposition mask 70 is bent or extended by its own weight. Also, the vapor deposition mask 70 and a frame or the like for holding the vapor deposition mask 70 do not need to be made big and heavy. Accordingly, vapor deposition by color can be easily performed on large-sized substrates.

Next, the function of the limiting portion 81 of the limiting unit 80 will now be described.

Figure 7:
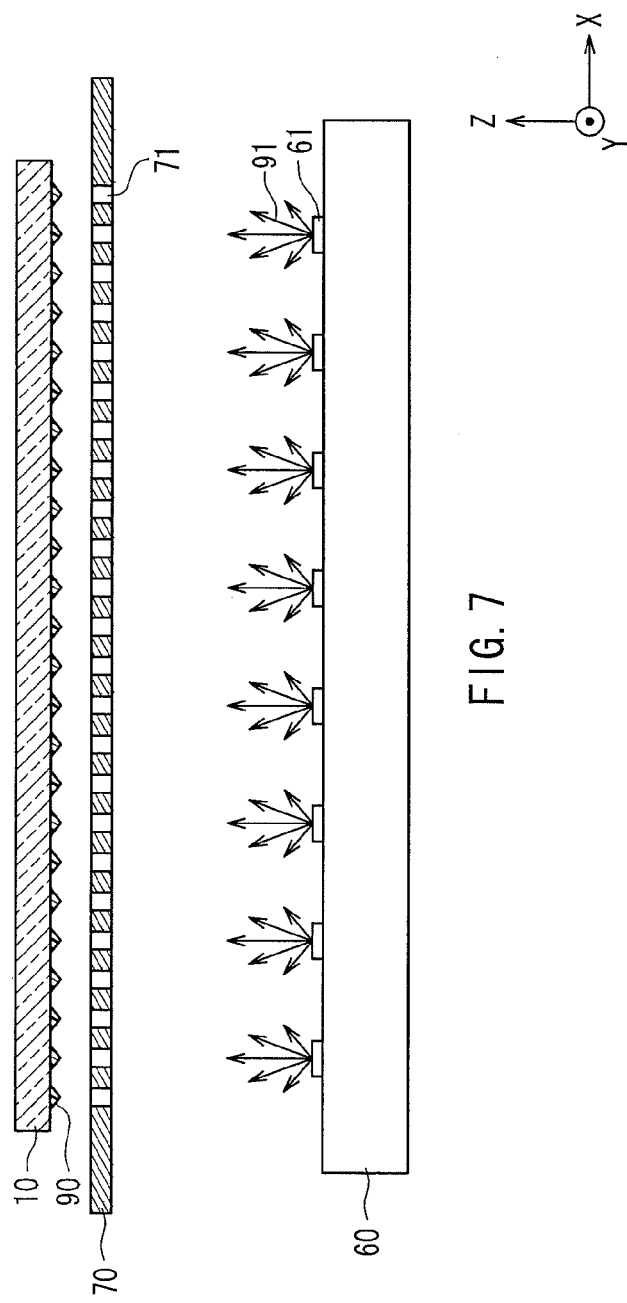
FIG. 7 is a front cross-sectional view of a vapor deposition device according to a comparative example in which the limiting unit is omitted in the vapor deposition device shown in FIG. 5.

FIG. 7 is a cross-sectional view, similarly to FIG. 6, showing a vapor deposition device according to a comparative example in which the limiting unit 80 is omitted in the vapor deposition device of Embodiment 1. In FIG. 7, the holding device 55 and the moving mechanism 56 are not shown in order to simplify the drawing. The vapor deposition particles 91 are discharged from the vapor deposition source openings 61 with a certain spread (directionality) in the X axis direction and in the Y axis direction. In Embodiment 1, the vapor deposition source openings 61 open in a direction parallel to the Z axis. The number of vapor deposition particles 91 discharged from the vapor deposition source openings 61 is the greatest in the opening direction (the Z axis direction in the present example) of the vapor deposition source openings 61, and gradually decreases as the angle (departure angle) formed with respect to the opening direction increases. The vapor deposition particles 91 discharged from the vapor deposition source openings 61 travel straight in their respective discharged direction. In FIG. 7, the flows of the vapor deposition particles 91 discharged from the vapor deposition source openings 61 are conceptually indicated by arrows. The length of the arrows corresponds to the number of vapor deposition particles 91. Accordingly, each mask opening 71 mostly receives, but not necessarily limited thereto, the vapor deposition particles 91 discharged from vapor deposition source openings 61 located directly below the mask opening 71 and also receives vapor deposition particles 91 discharged from vapor deposition source openings 61 located obliquely downward.

Figure 8:
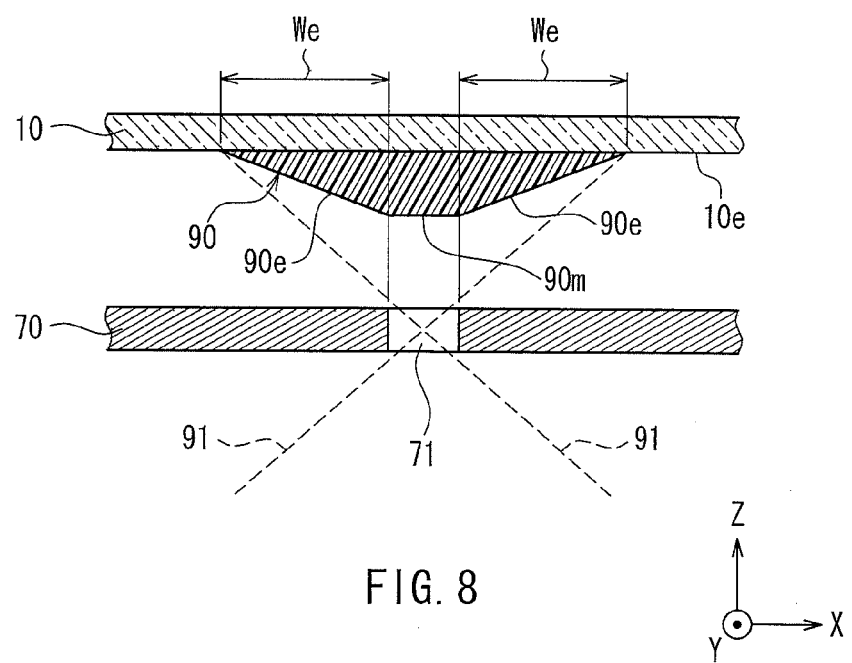
FIG. 8 is a cross-sectional view illustrating the cause of blurring generated at both edges of a coating film.

FIG. 8 is a cross-sectional view of a coating film 90 formed on a substrate 10 with the vapor deposition particles 91 that have passed through a mask opening 71 in the vapor deposition device according to the comparative example of FIG. 7, as viewed from a direction parallel to the Y axis as in FIG. 7. It is necessary to move the substrate 10 relative to the vapor deposition mask 70, and therefore there is a gap between the substrate 10 and the vapor deposition mask 70. In this state, as described above, the vapor deposition particles 91 coming from various directions pass through the mask opening 71. The number of vapor deposition particles 91 that reach a deposition surface 10e of the substrate 10 is the greatest in a region directly above the mask opening 71 and gradually decreases as the position gets farther away therefrom. Accordingly, as shown in FIG. 8, on the deposition surface 10e of the substrate 10, a coating film main portion 90m having a large and substantially constant thickness is formed in the region where the mask opening 71 is projected onto the substrate 10 from directly above, and blurred portions 90e that are gradually thinner as the position gets farther away from the coating film main portion 90m are formed on both sides of the coating film main portion 90m. Then, the blurred portions 90e cause blur at the edge of the coating film 90.

In order to reduce the width We of the blurred portion 90e, a space between the vapor deposition mask 70 and the substrate 10 needs only be reduced. However, because it is necessary to move the substrate 10 relative to the vapor deposition mask 70, it is not possible to reduce the space between the vapor deposition mask 70 and the substrate 10 to zero.

If the blurred portion 90e extends to the neighboring light emitting layer region having a different color due to an increase in the width We of the blurred portion 90e, it causes "color mixing" or degradation of the characteristics of the organic EL element. In order to prevent the blurred portion 90e from extending to the neighboring light emitting layer region having a different color, so as to not cause color mixing, it is necessary to reduce the opening width of pixels (the pixels referring to the sub-pixels 2R, 2G and 2B shown in FIG. 2) or to increase the pixel pitch so as to increase the non-light-emitting region. However, if the opening width of the pixels is reduced, the light-emitting region will be small, causing a reduction in brightness. If the current density is increased in order to obtain the required brightness, the organic EL element will have a short service life and easily be damaged, causing a reduction in reliability. If, on the other hand, the pixel pitch is increased, display of high definition images cannot be achieved, reducing the quality of display.

In contrast, in Embodiment 1, as shown in FIG. 6, the limiting unit 80 is provided between the vapor deposition source 60 and the vapor deposition mask 70.

Figure 9:
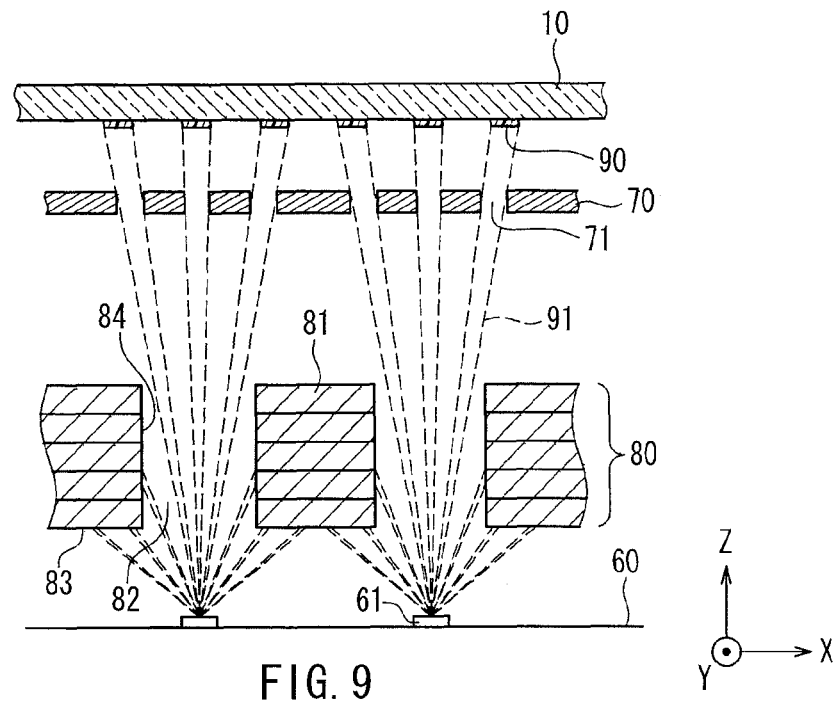
FIG. 9 is a cross-sectional view along a plane orthogonal to the movement direction of the substrate, showing how the coating film is formed on the substrate in the vapor deposition device according to Embodiment 1 of the present invention.

FIG. 9 is a cross-sectional view showing how the coating film 90 is formed on the substrate 10 in Embodiment 1, along the plane parallel to the XZ plane. In the present example, one vapor deposition source opening 61 is disposed for one limiting opening 82, and the vapor deposition source opening 61 is disposed at the central position of a pair of limiting portions 81 neighboring in the X axis direction. The representative flight pathways of the vapor deposition particles 91 discharged from the vapor deposition source openings 61 are indicated by dashed lines. Among the vapor deposition particles 91 discharged from the vapor deposition source opening 61 with a certain spread (a directionality), those passing through the limiting opening 82 directly above the vapor deposition source opening 61 and then passing through the mask opening 71 adhere to the substrate 10 so as to form the coating film 90. On the other hand, the vapor deposition particles 91 having a large velocity vector component in the X axis direction collide with and adhere to limiting portions 81 that define the limiting opening 82, and therefore cannot pass through limiting spaces 82 and cannot reach the mask openings 71.

In this manner, the limiting portions 81 limit the incidence angles of the vapor deposition particles 91 entering the mask openings 71 (or the substrate 10). As used herein, "incidence angles in the X axis direction" of the vapor deposition particles 91 with respect to the mask opening 71 (or the substrate 10) is defined as the angle formed between the flight direction of the vapor deposition particles 91 entering the mask opening 71 (or the substrate 10) and the Z axis on a projection onto the XZ plane.

In this manner, the plurality of limiting portions 81 of the limiting unit 80 improve the directionality of the vapor deposition particles 91 in the X axis direction entering the substrate 10. In other words, the plurality of limiting portions 81 determines which vapor deposition source opening 61 discharges the vapor deposition particles 91 that pass through each mask opening 71 among the plurality of vapor deposition source openings 61. Therefore, the width We of the blurred portion 90e resulting from the vapor deposition particles 91 can be reduced.

Note that the supporting base 85 (see FIG. 6) is disposed at the circumference of the limiting unit 80, and therefore the supporting base 85 does not limit the incidence angles of the vapor deposition particles 91 in the X axis direction entering the mask opening 71.

It is preferable that all of the vapor deposition particles 91 enter each mask opening 71 are discharged only from the same vapor deposition source opening 61. In other words, it is preferable that vapor deposition particles 91 discharged from different vapor deposition source openings 61 do not enter the same mask opening 71. Accordingly, the width We of the blurred portion 90e can be further reduced.

As described above, according to Embodiment 1, even if the substrate 10 and the vapor deposition mask 70 are spaced apart, the width We of the blurred portion 90e at the edge of the coating film 90 to be formed on the substrate 10 can be reduced. Therefore, vapor deposition by color for forming light emitting layers 23R, 23G and 23B using Embodiment 1 can prevent color mixing from occurring. Accordingly, the pixel pitch can be reduced, and in this case, it is possible to provide an organic EL display device that is capable of displaying high definition images. Meanwhile, the light-emitting region may be enlarged without changing the pixel pitch, and in this case, it is possible to provide an organic EL display device that is capable of displaying high definition images. Also, because it is not necessary to increase the current density in order to increase the brightness, the organic EL element does not have a short service life and is not easily damaged, and a reduction in reliability can be prevented.

Figure 10:
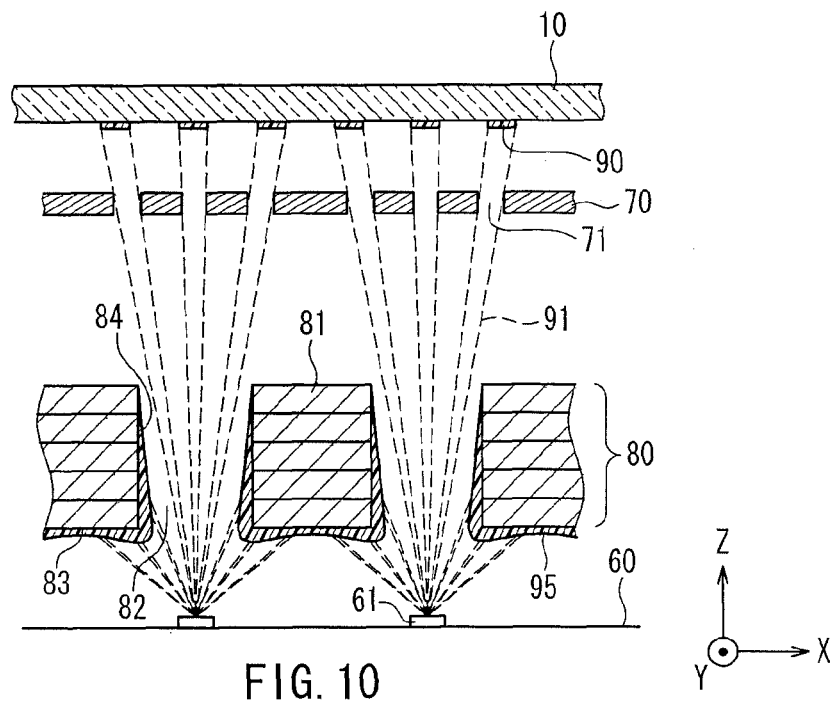
FIG. 10 is a cross-sectional view along a plane orthogonal to movement direction of the substrate illustrating a problem that the vapor deposition material adheres to the limiting unit in the vapor deposition device according to Embodiment 1 of the present invention.

However, as can be easily understood from FIG. 9, as shown in FIG. 10, if the coating film 90 is continuously formed on the substrate 10 using the vapor deposition device of Embodiment 1 for a long period of time, the vapor deposition particles 91 are captured by and accumulate on the limiting portion 81, as a result of which the vapor deposition material 95 adheres to the limiting portions 81. The vapor deposition material 95 adheres to a lower surface (a surface facing the vapor deposition source) 83 of the limiting portion 81 and/or side surfaces (a surface facing the limiting portions 81 neighboring in the X axis direction) 84 of the limiting portion 81, although the amount of the vapor deposition material adhering thereto depends on the relative positional relationship between the vapor deposition source openings 61 and the limiting portions 81 and the like. The amount of the vapor deposition material 95 adhering to the limiting portion 81 generally increases as the function of limiting the incidence angles of the vapor deposition particles 91 in the X axis direction is further improved, that is, as the width We of the blurred portion 90e is further reduced.

If the amount of the vapor deposition material 95 adhering to the limiting portion 81 increases, the vapor deposition material 95 comes off and falls, and contaminates the inside of the vapor deposition device. If the vapor deposition material 95 that comes off falls on the vapor deposition source 60, the vapor deposition material is heated and re-vaporized, and adheres to the substrate 10 at an undesired position, as a result of which the yield is reduced. Also, if the vapor deposition material that comes off falls on the vapor deposition source openings 61, vapor deposition source openings 61 become blocked with the vapor deposition material, and the coating film 90 cannot be formed at a desired position on the substrate 10.

Therefore, it is necessary to regularly perform the maintenance of the limiting unit 80 so as to prevent the amount of vapor deposition material 95 adhering thereto from exceeding a predetermined amount.

Hereinafter, a maintenance method for the limiting unit 80 in the vapor deposition device according to Embodiment 1 will now be described.

FIGS. 11A to 11D are diagrams showing the procedure for replacing the plate members 811 to 815 constituting the limiting unit 80 in order in the vapor deposition device according to Embodiment 1. In order to simplify the drawing, the limiting portions 81 and the limiting openings 82 of the limiting unit 80 are not shown in these diagrams. Also, members other than the limiting unit 80 are not shown.

Figure 11A:
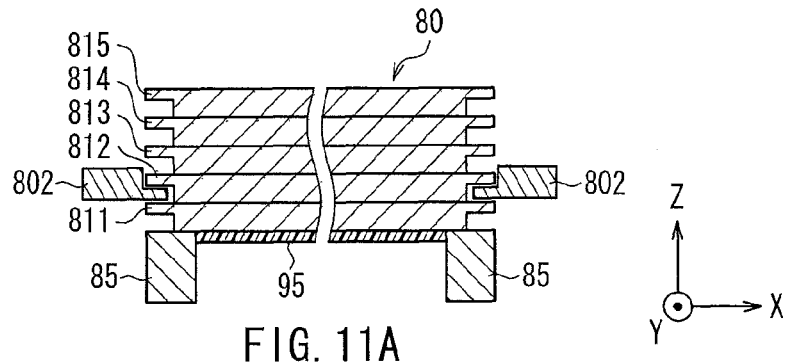
FIGS. 11A to 11D are diagrams showing the procedure of replacing the plate members constituting the limiting unit in order, in the vapor deposition device according to Embodiment 1 of the present invention.
Figure 11B:
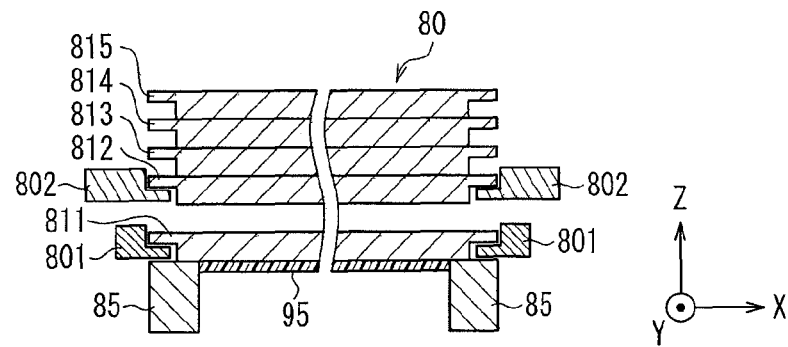

As shown in FIG. 11A, five plate members 811 to 815 are stacked in order from the lower side (the side of the vapor deposition source 60) to the upper side (the side of the substrate 10). These five plate members 811 to 815 are placed on the supporting base 85. Both ends of each of the plate members 811 to 815 in the X axis direction are thinned, and steps are formed on the lower surfaces thereof. If vapor deposition is performed in a state of FIG. 11, the vapor deposition material 95 adheres to the lower surface (the surface facing the vapor deposition source 60) of the plate member 811 that is the undermost layer, as described in FIG. 10.

If a vapor deposition material 95 having a predetermined thickness adheres thereto, vapor deposition is discontinued. As shown in FIG. 11, temporary holding arms 802 are then engaged with the steps of the both ends of the plate member 812, and the plate members 812 to 815 that are the second layer or higher from the bottom are lifted upwardly with the plate member 811 that is the undermost layer remaining. Replacement arms 801 are engaged with the steps of the plate member 811 that is the undermost layer, and the plate member 811 is removed from the supporting base 85. The removed plate member 811 is transported to the outside of the vapor deposition chamber and cleaned so as to remove the vapor deposition material 95 that has adhered thereto. The vapor deposition material 95 may be recovered and re-used as necessary.

Figure 11C:
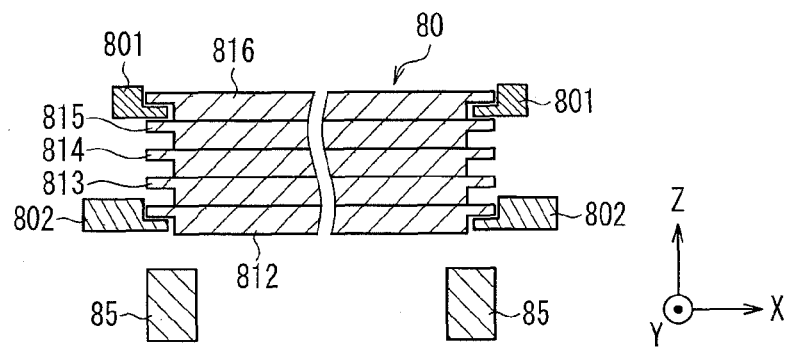

Next, as shown in FIG. 11C, a clean plate member 816 is transported to the inside of the vapor deposition chamber with the replacement arms 801, and is placed on the plate member 815 that is the uppermost layer.

Figure 11D:
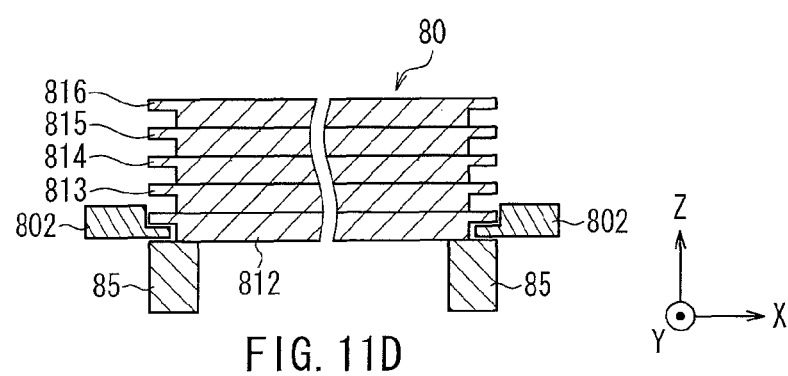

Next, as shown in FIG. 11D, five plate members 812, 813, 814, 815 and 816 stacked from the lower side (the side of the vapor deposition source 60) to the upper side (the side of the substrate 10) are lowered on the supporting base 85. Thereafter, the engagement between the temporary holding arms 802 and the plate member 812 is released, and the temporary holding arms 802 are retracted.

This ends the maintenance of the limiting unit 80. Thereafter, vapor deposition is re-started.

Subsequently, if a predetermined amount of the vapor deposition material 95 has adhered to the lower surface of the plate member that is the undermost layer, the vapor deposition is discontinued, the plate member that is the undermost layer is removed and a clean plate member is stacked on the plate member that is the uppermost layer instead of the removed plate member, similarly to FIGS. 11A to 11D. Plate members constituting the limiting unit 80 move downwardly one by one in order in each maintenance of the limiting unit 80. The total number of plate members constituting the limiting unit 80 is always constant. Because the thickness (the dimension in the Z axis direction) of each plate member is the same, the thickness (the dimension in the Z axis direction) of the limiting portion 81 is constant even if the plate members are replaced.

As can be understood from the description in FIG. 9, in order to make only the vapor deposition particles 91 discharged from a desired vapor deposition source opening 61 enter each mask opening 71, it is necessary to accurately align the limiting unit 80 (in particular, the limiting portions 81 thereof) with respect to the vapor deposition source opening 61 in the X axis direction and the Y axis direction.

To achieve this, it is preferable that the plate member 815 that is the uppermost layer is accurately aligned with a clean plate member 816 to be added thereto, as in FIG. 11. The alignment of the plate member 816 can be performed by, for example, using the replacement arms 801 when the plate member 816 is placed on the plate member 815 that is the uppermost layer.

Also, it is preferable that five plate members 812, 813, 814, 815 and 816 placed on the supporting base 85 are accurately aligned with one another as in FIG. 11D. This alignment can be performed by, for example, using the temporary holding arms 802 before placing the five plate members 812, 813, 814, 815 and 816 on the supporting base 85, or by moving the supporting base 85 after placing the five plate members 812, 813, 814, 815 and 816 on the supporting base 85.

A position adjustment mechanism for performing the above-described alignment may be provided in the replacement arms 801, the temporary holding arms 802 and the supporting base 85 as necessary. Of course, in the case where positional changes of the limiting portions 81 and the limiting openings 82 resulting from the replacement of the plate members are significantly small enough to be ignored, the above-described alignment is not required. For example, a positioning mechanism that is capable of automatically aligning a plurality of plate members with the supporting base 85 can be provided. Specifically, a shape that fits a plate with other plates (for example, a protruded portion and a recessed portion having a conical surface) may be formed in the upper surface of the supporting base 85 and the upper and lower surfaces of each of the plate members, and when a member is stacked, the alignment may be automatically performed between the upper member and the lower member due to the shape.

Figure 12:
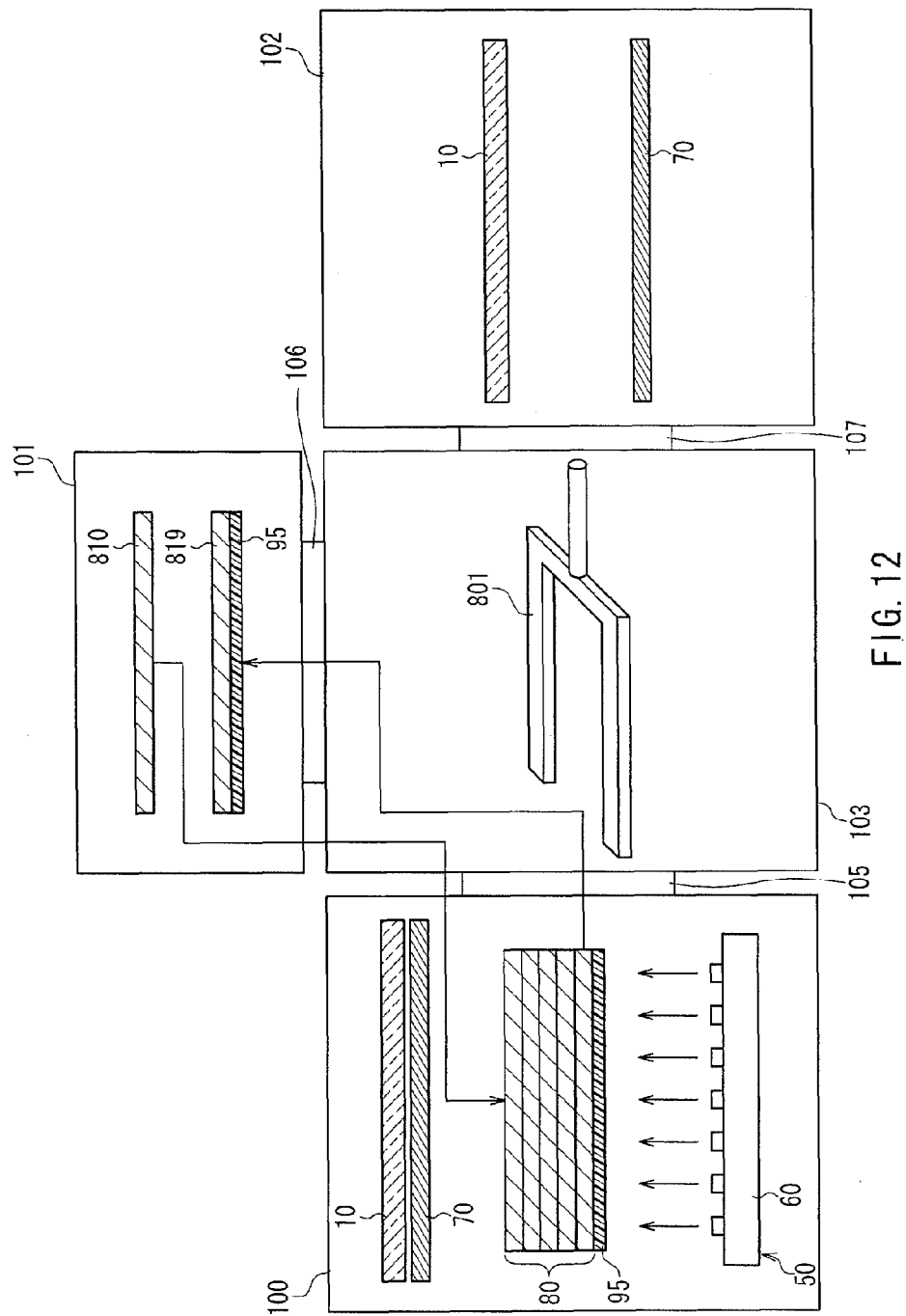
FIG. 12 is a diagram showing the overall configuration of a vapor deposition system including a system of regenerating the limiting unit and the vapor deposition device according to Embodiment 1 of the present invention.

FIG. 12 shows an example of the overall configuration of a vapor deposition system including a system of regenerating the limiting unit 80 and the vapor deposition device.

A coating film is formed on the substrate 10 in the vapor deposition chamber 100, using the vapor deposition unit 50. A transport chamber 103 is connected to the vapor deposition chamber 100 via a door 105 capable of opening and closing. The replacement arms 801 are accommodated in the transport chamber 103. The replacement arms 801 have engagement portions having, for example, a substantially "U" shape. It is preferable that the transport chamber 103 is kept in a state in which the pressure is reduced to the equivalent pressure of the vapor deposition chamber 100. A first load lock chamber 101 and a second load lock chamber 102 are connected to the transport chamber 103 respectively via doors 106 and 107 capable of opening and closing.

A clean plate member 810 constituting the limiting unit 80 and a used plate member 819 to which the vapor deposition material 95 has adhered and that is removed from the vapor deposition chamber 100 are accommodated in the first load lock chamber 101. The plate member 819 to which the vapor deposition material 95 has adhered is transported from the vapor deposition chamber 100 to the first load lock chamber 101, and a clean plate member 810 is transported from the first load lock chamber 101 to the vapor deposition chamber 100 by using the replacement arms 801 via the transport chamber 103. The vapor deposition material 95 is removed from the plate member 819 inside the first load lock chamber 101 or outside the first load lock chamber 101. The plate member from which the vapor deposition material 95 is removed is stored in the first load lock chamber 101 as a clean plate member 810.

The substrate 10 and various types of vapor deposition masks 70 after or before vapor deposition are accommodated in the second load lock chamber 102. The substrate 10 before vapor deposition is transported from the second load lock chamber 102 to the vapor deposition chamber 100, and the substrate after vapor deposition is transported from the vapor deposition chamber 100 to the second load lock chamber 102 by using the replacement arms 801 via the transport chamber 103. The vapor deposition mask 70 is appropriately selected in accordance with the pattern of a coating film to be formed on the substrate 10. The vapor deposition mask 70 is replaced by using the replacement arms 80 via the transport chamber 103 between the vapor deposition chamber 100 and the second load lock chamber 102.

As described above, according to Embodiment 1, the limiting unit 80 is constituted by a plurality of plate members stacked vertically, and therefore the maintenance of the limiting unit 80 is completed simply by removing only the plate member that is the undermost layer to which the vapor deposition material 95 has adhered and stacking a clean plate member on the plate member that is the uppermost layer.

In order for the limiting portion 81 to exhibit the function, which has been described with FIG. 9, of limiting the incidence angles of the vapor deposition particles 91 in the X axis direction, there is a lower limit for the dimension of the limiting portion 81 in the Z axis direction. Also, if the limiting portion 81 is positionally offset in the Z axis direction by bending due to its own weight, the above-described function of limiting the incidence angle is not realized, and therefore the limiting unit 80 including the limiting portions 81 is desired to have rigidity. Therefore, it is difficult to reduce the thickness of the limiting unit 80. If such a limiting unit 80 is configured by an integral-type limiting unit constituted by one integrated component, instead of being configured by a plurality of plate members capable of being separated therefrom as in Embodiment 1, the thickness and the weight of the integral-type limiting unit are increased. If the vapor deposition material has adhered to the integral-type limiting unit, it is necessary to replace the entire integral-type limiting unit, as a result of which the operation for maintenance will become complicated.

Embodiment 1 in which the limiting unit 80 including the plurality of plate members stacked on one another is used achieves the following effect, as compared with a case where such an integral-type limiting unit is used.

With Embodiment 1, when the vapor deposition material has adhered to the limiting unit 80, it is sufficient that only one plate member of the plurality of plate members constituting the limiting unit 80 is replaced. It is sufficient that only one thin and lightweight plate member is moved, and therefore it is not necessary for members for transporting plate members to have a relatively high load-carrying capacity. For example, as described with FIG. 12, the plate members can be replaced by using the existing replacement arms 801 that transport the substrate 10 and the vapor deposition mask 70. Therefore, it is possible to reduce an increase in the cost of vapor deposition equipment.

Also, one thin and lightweight plate member needs only to be transported by using small-sized and simple replacement arms 801, and therefore it is not necessary to return the pressure inside the vapor deposition chamber 100 to atmospheric pressure by opening the vapor deposition chamber 100 in order to replace the plate member. For example, similarly to a case where the substrate 10 or the vapor deposition mask 70 is replaced, the plate member can be replaced by opening only the door 105 located between the vapor deposition chamber 100 and the transport chamber 101 in FIG. 12. Therefore, the need to stop vapor deposition for a long period of time in order for maintenance of the limiting unit 80 (that is, replacement of the plate member) is eliminated, and therefore the throughput of the vapor deposition device is improved.

Furthermore, the operation for removing the vapor deposition material that has adhered thereto is more easily performed on a thin and lightweight plate member than on a thick and heavyweight integral-type limiting unit. Also, equipment for removing the vapor deposition material can be made small. Furthermore, it is possible to reduce the size of the first load lock chamber 101 that stores clean plate members. Therefore, it is possible to reduce vapor deposition cost and equipment cost owing to these points.

Maintenance of the limiting unit 80 is easily performed, and therefore the maintenance frequency can be increased without an increase in vapor deposition cost or a decrease in throughput. Accordingly, it is possible to reliably prevent the vapor deposition material that has adhered to the plate member from coming off and falling, and therefore the yield and the quality of organic EL elements can be improved.

In the above-described example, the temporary holding arms 802 described with FIGS. 11A to 11D are used in order to replace plate members. It is sufficient that the temporary holding arms 802 are provided with a mechanism for holding, raising and lowering a plurality of plate members and a mechanism for finely-adjusting the position of the plate member in the X axis direction and the position thereof in the Y axis direction as necessary. It is not necessary for the temporary holding arms 802 to also hold the supporting base 85 on which the plurality of plate members are placed. In other words, it is not necessary for the temporary holding arms 802 to have a mechanism for moving the plurality of plate members for a long distance, or to have a mechanical strength for holding a heavyweight article. Therefore, the size of the vapor deposition device and the cost are only slightly increased as a result of providing the temporary holding arms 802. Also, it is possible to easily provide high rigidity in such temporary holding arms 802, and therefore the positional offsets of the limiting portions 81 and the limiting openings 82 that are caused by the replacement of a plate member can be reduced.

At the time of replacing a plate member, it is necessary for the plate member to be accurately aligned in the X axis direction and in the Y axis direction. With the present embodiment, if the temporary holding arms 802 are capable of raising and lowering the plurality of plate members in the X axis direction and the Y axis direction without the positional offsets, it is sufficient that one clean plate member (the plate member 816 in FIG. 11C) is accurately positioned on the plate member that is the uppermost layer. A thin and lightweight plate member is significantly easily positioned, as compared with positioning a thick and heavyweight integral-type limiting unit, and moreover the accuracy in positioning can be easily improved. Also, as described above, if a positioning mechanism for automatically aligning a plate member when stacking the plate member on another plate member is provided, it is possible to further simplify or omit the operation for alignment.

Individual plate members constituting the limiting unit 80 are thin, and therefore they are easily processed. For example, the processing of a through hole for forming the limiting opening 82 is more easily performed at a lower cost on a thin plate member than on a thick integral-type limiting unit, and the accuracy in the processing can be easily improved.

The limiting unit 80 is heated by receiving a radiant heat from the vapor deposition source 60. The integral-type limiting unit has a large heat capacity, and therefore in the case where the entire limiting unit is replaced, there may be a case where a long period of time is required for the temperature of the limiting unit to be stabilized, and vapor deposition cannot be started during this period. In contrast, with Embodiment 1, one plate member has a small heat capacity, and therefore the temperature of the entire limiting unit 80 is stabilized in a short period of time after the replacement of the plate members. Therefore, Embodiment 1 can improve the throughput of the vapor deposition device owing to this point.

Also, with Embodiment 1, the plate member that is located nearest to the vapor deposition source 60, and thus heated to the highest temperature is removed. Removing this plate member leads to the effect of exhausting heat from the heated limiting unit 80. Therefore, warping or deformation of the limiting portion 81 resulting from the limiting portion 81 being heated to a high temperature can be suppressed while contributing to cooling of the limiting unit 80.

In the present embodiment, in the case where a cooling device for cooling the limiting unit 80 is installed, the position of the installation is arbitrary. For example, the cooling device may be incorporated in the supporting base 85, and alternatively, it may be placed on the plate member that is the uppermost layer (the plate member 815 in FIG. 11A). In the case of placing the cooling device on the plate member that is the uppermost layer, a clean plate member 916 is inserted between the plate member that is the uppermost layer and the cooling device with the cooling device being lifted. In the case where the cooling device is fixed to the plate member that is the uppermost layer, the clean plate member 916 is inserted below the plate member that is the uppermost layer with the plate member that is the uppermost layer being lifted along with the cooling device.

Also, a through hole for inserting the cooling device may be formed in each of the plate members, separately from through holes constituting the limiting opening 82.

With the present embodiment, the plate member that is placed on the uppermost layer gradually moves downward in each maintenance of the limiting unit 80, and is removed from the undermost layer after the same number of maintenances as there are number of plate members constituting the limiting unit 80 has been performed. Therefore, a period during which each plate member is used until removed (a vapor deposition period) is substantially the same for any plate member, and the amount of the vapor deposition material 95 that has adhered thereto is also substantially the same as any plate members.

As described with FIG. 10, the vapor deposition material 95 adheres to not only the lower surface 83 of the limiting portion 81 but also the side surfaces 84 thereof. The present embodiment can be preferably used for a case where a relatively larger amount of the vapor deposition material 95 adheres to the lower surface 83 than the side surfaces 84.

Although the number of plate members constituting the limiting unit 80 is five in the above-described example, the present invention is not limited to this, and the number may be larger or smaller than this. The number of plate members can be appropriately set, taking into consideration the dimension of the limiting portion 81 in the Z axis direction, the thickness of one plate member, and the like.

Although a clean plate member is stacked on the upper surface of the plate member that is the uppermost layer in the above-described example, it may be inserted at an arbitrary position between the plate member that is the uppermost layer and the plate member that is the undermost layer.

The arms 801 and 802 are not limited to the above-described example, and may have an arbitrary configuration other than the above. Although steps are formed at the edges of the plate member in order to hold the plate member in the above-described example, these steps can be omitted or substituted by other shapes as long as the plate member can be lifted or transported.

Embodiment 2

With Embodiment 1 described above, the plate member that is the undermost layer to which that vapor deposition material 95 has adhered is removed from the vapor deposition chamber 100, and a clean plate member other than this is stacked on the plate member that is the uppermost layer. In contrast, with Embodiment 2, in the case where the vapor deposition material 95 has adhered to only the lower surface of the plate member that is the undermost layer, the plate member is turned over and stacked on the plate member that is the uppermost layer, instead of removing the plate member from the vapor deposition chamber 100.

Hereinafter, Embodiment 2 will now be described, focusing on differences from Embodiment 1. In diagrams referenced in the following description, the same reference numerals are given to components corresponding to the components described in Embodiment 1, and redundant description thereof will be omitted.

Hereinafter, the maintenance method for the limiting unit 80 in the vapor deposition device according to Embodiment 2 will now be described.

FIGS. 13A to 13D are diagrams showing the procedure of replacing the plate members 811 to 815 constituting the limiting unit 80 in order, in the vapor deposition device according to Embodiment 2. In order to simplify the drawing, the limiting portions 81 and the limiting openings 82 of the limiting unit 80 are not shown in these diagrams. Also, members other than the limiting unit 80 are not shown. Also, members for replacing, raising and lowering plate members constituting the limiting unit 80 (for example, the replacement arms 801 and the temporary holding arms 802 shown in FIGS. 11A to 11D), an engagement structure formed in the plate members in order to cause the members to be engaged with one another, and the like are not shown.

Figure 13A:
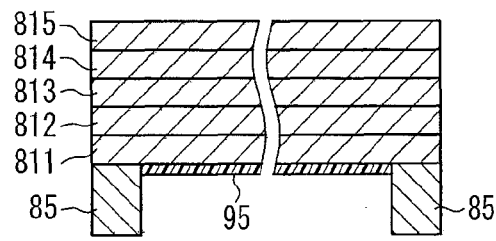
FIGS. 13A to 13D are diagrams showing the procedure of replacing the plate members constituting the limiting unit in order, in a vapor deposition device according to Embodiment 2 of the present invention.
Figure 13A:
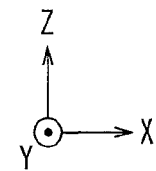

As shown in FIG. 13A, five plate members 811 to 815 are stacked in order from the lower side (the side of the vapor deposition source 60) to the upper side (the side of the substrate 10). These five plate members 811 to 815 are placed on the supporting base 85. If vapor deposition is performed in the state of FIG. 13, the vapor deposition material 95 adheres to the lower surface (the surface facing the vapor deposition source 60) of the plate member 811 that is an undermost layer, as described in FIG. 10.

Figure 13B:
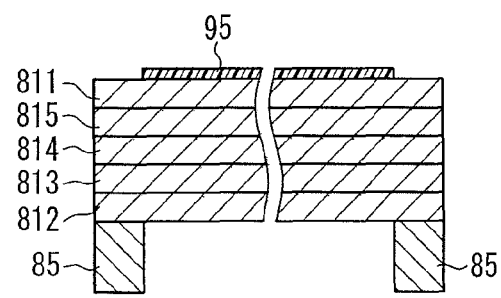
Figure 13B:
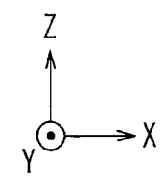

If the vapor deposition material 95 having a predetermined thickness has adhered thereto, vapor deposition is discontinued, and as shown in FIG. 13B, the plate member 811 that is the undermost layer is removed from between the supporting base 85 and the plate member 812, turned over, and placed on the plate member 815 that is the uppermost layer. The plate member 811 is turned over, and thus the vapor deposition material 95 that has adhered to the lower surface of the plate member 811 in FIG. 13A adheres to the upper surface (the surface facing the vapor deposition mask) of the plate member 811 in FIG. 13B.

Thereafter, vapor deposition is re-started. If the vapor deposition material 95 having a predetermined thickness has adhered to the lower surface of the plate member 812 that is the undermost layer, similarly to FIG. 13B, the plate member 812 is turned over and placed on the plate member 811 that is the uppermost layer.

Hereinafter, similar operations are performed until the plate member 811 moves to the undermost layer.

Figure 13C:
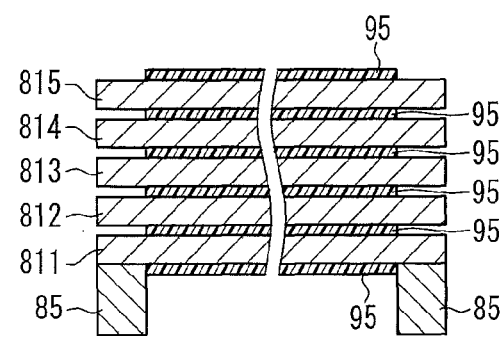
Figure 13C:
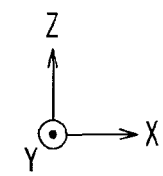
Figure 13D:
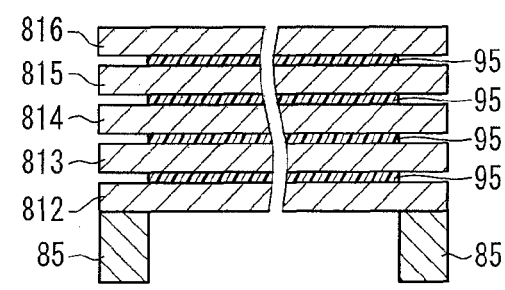
Figure 13D:
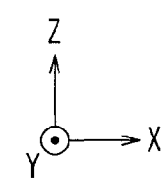

As shown in FIG. 13C, if the vapor deposition material 95 having a predetermined thickness has adhered to the lower surface of the plate member 811 that has moved to the undermost layer, vapor deposition is discontinued. The vapor deposition material 95 has adhered to the both side surfaces, namely the upper surface and the lower surface of this plate member 811. In view of this, the plate member 811 that is the undermost layer is removed from between the supporting base 85 and the plate member 812, and transported to the outside of the vapor deposition chamber 100 to remove the vapor deposition material 95 that has adhered to the both side surfaces. As shown in FIG. 13D, a clean plate member 816 is then placed on the plate member 815 that is the uppermost layer, instead of the plate member 811.

Thereafter, vapor deposition is re-started. If the vapor deposition material 95 having a predetermined thickness has adhered to the lower surface of the plate member 812 that is the undermost layer, similarly to FIG. 13C, the plate member 812 is transported to the outside of the vapor deposition chamber, and a new clean plate member is placed on the plate member 816 that is the uppermost layer, instead of the plate member 812.

Hereinafter, similar operations are performed until the plate member 816 moves to the undermost layer.

If the plate member 816 moves to the undermost layer, a state substantially returns to the above-described state of FIG. 13A. Subsequently, the above-described operations are repeated.

As described above, according to Embodiment 2, the plate members constituting the limiting unit 80 is removed from the vapor deposition chamber after the vapor deposition material 95 has adhered to the both side surfaces, and a clean plate member is transported to the inside of the vapor deposition chamber instead of the removed plate member. Therefore, for example, in the vapor deposition system shown in FIG. 12, the frequency at which a plate member is replaced via the door 105 is reduced with Embodiment 2, as compared with Embodiment 1. Therefore, the throughput of the vapor deposition device is further improved. Also, the frequency of processing in which the vapor deposition material is removed from the plate member that is removed from the vapor deposition chamber is also reduced. Furthermore, the number of stored clean plate members can be reduced.

Note that the plate member of which the vapor deposition material 95 has adhered onto one side surface is overlaid in Embodiment 2, and therefore, to be exact, the thickness (the dimension in the Z axis direction) of the limiting unit 80 in the state of FIG. 13A is different from in the state of FIG. 13C, for example. However, in fact, the thickness of the vapor deposition material 95 is significantly thin with respect to the thickness of the plate member. Therefore, the above-described changes in the thickness of the limiting unit 80 are substantially hardly problematic.

Although the plate member of which the vapor deposition material 95 has adhered onto one side surface and a clean plate member are stacked on the upper surface of the plate member that is the uppermost layer in the above-described example, they may be inserted into an arbitrary position between the plate member that is the uppermost layer and the plate member that is the undermost layer.

Embodiment 2 is the same as Embodiment 1 except for the above.

Embodiment 3

In Embodiments 1 and 2 described above, all of the plurality of plate members constituting the limiting unit 80 are the same. In contrast, in Embodiment 3, each of the plurality of plate members constituting the limiting unit 80 has a different arrangement of through holes.

Hereinafter, Embodiment 3 will now be described, focusing on differences from Embodiments 1 and 2. In diagrams referenced in the following description, the same reference numerals are given to components corresponding to the components described in Embodiment 1, and redundant description thereof will be omitted.

In order to simplify description, Embodiment 3 will be described, using an example in which the limiting unit 80 is constituted by three plate members.

Figure 14:
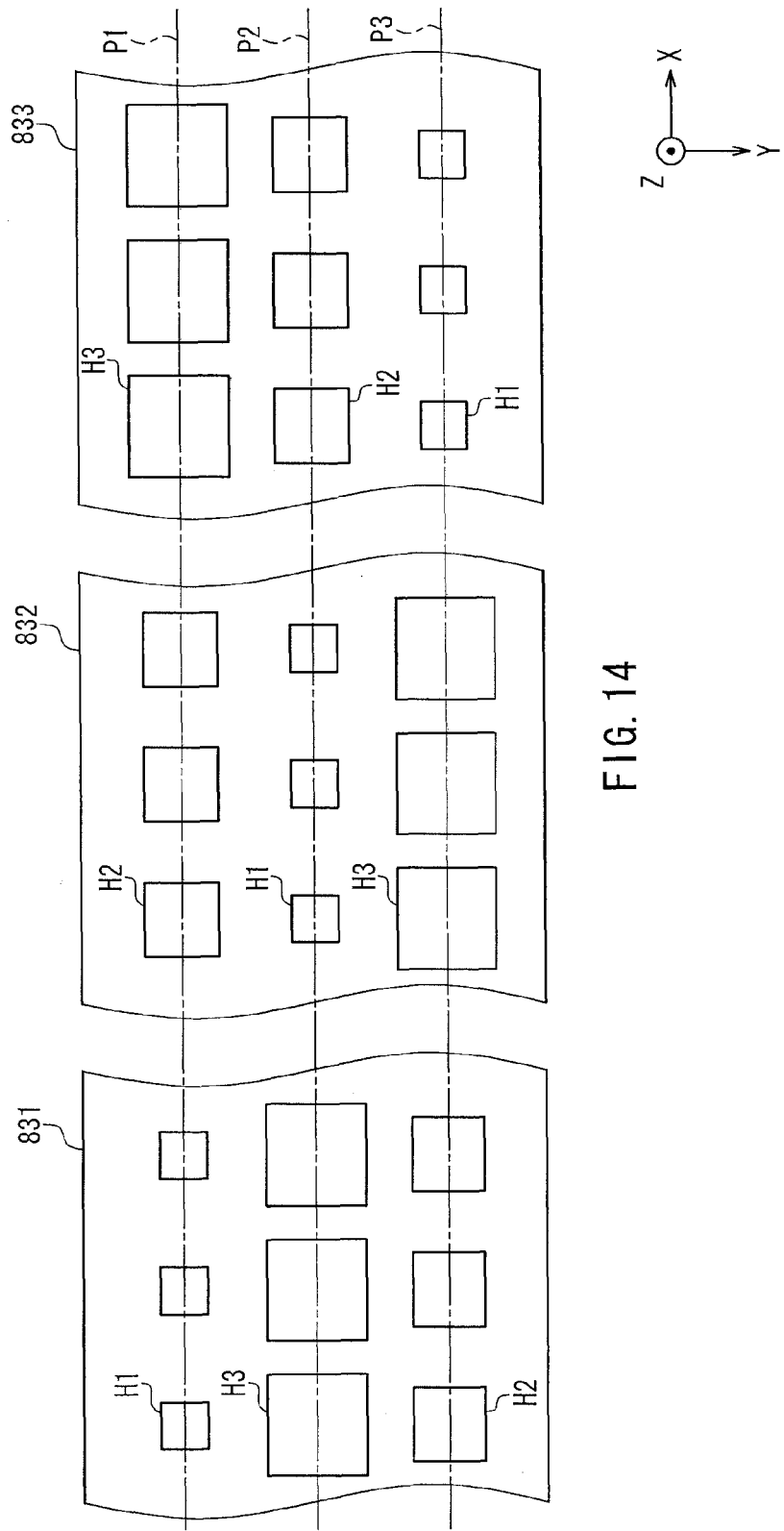
FIG. 14 is a partial plan view of three types of plate members constituting a limiting unit in a vapor deposition device according to Embodiment 3 of the present invention.

FIG. 14 is a partial plan view of three plate members 831, 832 and 833 constituting a limiting unit 80 of a vapor deposition device according to Embodiment 3. The plate members 831, 832 and 833 have the same external dimensions (that is, outer dimensions in the X axis direction, the Y axis direction and Z axis direction). Three different types of through holes H1, H2 and H3 whose opening width is different from one another are formed at the positions of lattice points in the plate member 831, 832 and 833. However, the arrangements of the through holes H1, H2 and H3 are different in the plate members 831, 832 and 833. The opening width increases in order from through hole H1, through hole H2, to through hole H3.

As shown in FIG. 14, three planes that are parallel to the XZ plane and are disposed at a fixed pitch in the Y axis direction are respectively denoted by planes P1, P2 and P3.

The through holes H1, H3 and H2 are respectively formed along the planes P1, P2 and P3 in the plate member 831. The through holes H2, H1 and H3 are respectively formed along the planes P1, P2 and P3 in the plate member 832. The through holes H3, H2 and H1 are respectively formed along the planes P1, P2 and P3 in the plate member 833.

The pitches of the through holes H1, H2 and H3 in the X axis direction are the same in each of the plate members 831, 832 and 833, and the through holes H1, H2 and H3 are arranged at the same positions in the X axis direction. Also, each pitch of the through holes H1, H2 and H3 in the X axis direction is the same in the plate members 831, 832 and 833.

As shown in FIG. 15, the plate members 831, 832 and 833 are stacked in the Z axis direction in order from the lower side (the side of the vapor deposition source 60). These stacked plate members 831, 832 and 833 are placed on the supporting base 85. Three types of through holes H1, H2 and H3 are arranged in the plate members 831, 832 and 833 as in FIG. 14, and therefore three types of through holes H1, H2 and H3 are in communication with one another in the Z axis direction. The centers of the three types of through holes H1, H2 and H3 that are in communication in the Z axis direction match, as viewed in a direction parallel to the Z axis. The through hole H1, the through hole H2 and the through hole H3 are disposed in this order from the bottom to the top on the plane P1, the through hole H3, the through hole H1 and the through hole H2 are disposed in this order from the bottom to the top on the plane P2, and the through hole H2, the through hole H3 and the through hole H1 are disposed in this order on the plane P3.

A vapor deposition method using the limiting unit 80 of Embodiment 3 configured in this manner will be described below.

FIGS. 16A to 16D are diagrams showing the procedure of replacing the plate members 831 to 833 constituting the limiting unit 80 in order, in the vapor deposition device according to Embodiment 3 of the present invention. In order to simplify the drawing, members other than the limiting unit 80 and the vapor deposition source openings 61 are not shown in these diagrams. Also, members for replacing, raising and lowering plate members 831 to 833 constituting the limiting unit 80 (for example, the replacement arms 801 and the temporary holding arms 802 shown in FIGS. 11A to 11D), an engagement structure formed in the plate members 831 to 833 in order to cause the members to be engaged with one another, and the like are not shown.

Figure 16A:
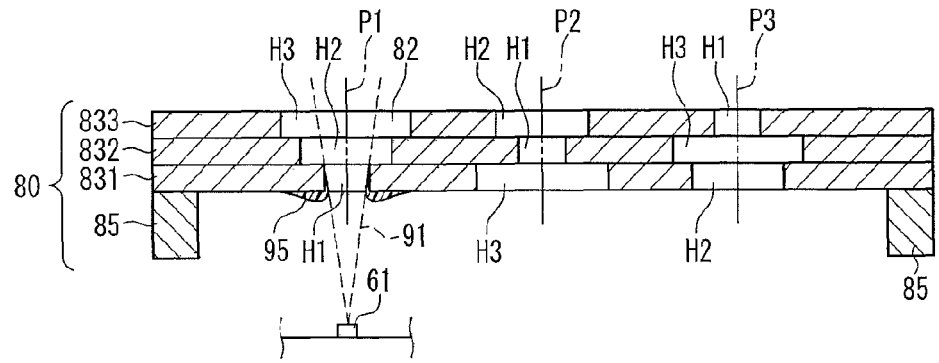
FIG. 16A is a diagram showing the procedure of replacing a plate member constituting the limiting unit, in the vapor deposition device according to Embodiment 3 of the present invention.

In FIG. 16A, similarly to FIG. 15, the plate members 831, 832 and 833 are stacked in the Z axis direction in order from the lower side (the side of the vapor deposition source 60). The vapor deposition source opening 61 is disposed on the plane P1. The through hole H1, the through hole H2 and the through hole H3 are disposed in this order from the bottom to the top above the vapor deposition source opening 61. In this state, the vapor deposition particles 91 are discharged from the vapor deposition source opening 61. The vapor deposition particles 91 pass through the through hole H1, the through hole H2 and the through hole H3 disposed on the plane P1 in this order, further pass through the mask openings 71 of the vapor deposition mask 70, and adhere to the substrate 10 to form the coating film 90 (see FIGS. 5 and 6). The vapor deposition particles 91 discharged from the vapor deposition source opening 61 do not pass through the through holes H3, H1 and H2 disposed on the plane P2, nor the through holes H2, H3 and H1 disposed on the plane P3 to reach the substrate 10. The vapor deposition material 95 adheres to a portion in the vicinity of the through hole H1 and the inner circumferential surface of the through hole H1 on the lower surface (the surface facing the vapor deposition source opening 61) of the plate member 831 that is the undermost layer, over time.

Figure 16B:
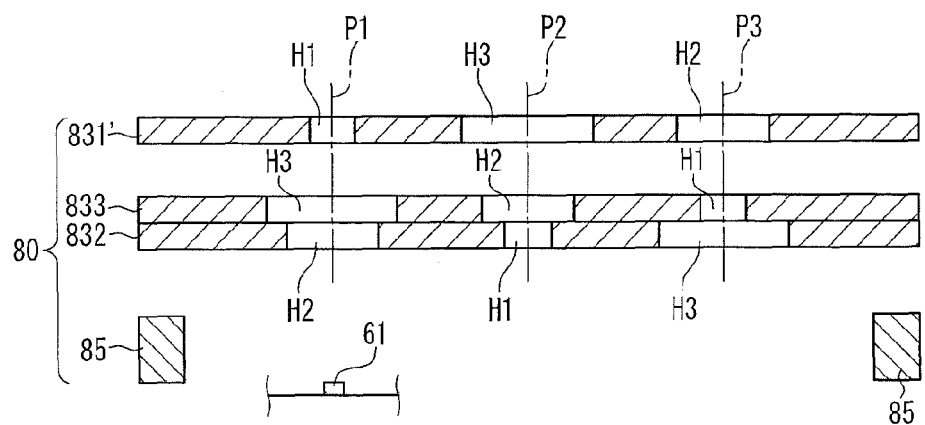
FIG. 16B is a diagram showing the procedure of replacing a plate member constituting the limiting unit, in the vapor deposition device according to Embodiment 3 of the present invention.

If the vapor deposition material 95 having a predetermined thickness has adhered thereto, vapor deposition is discontinued, and as shown in FIG. 16B, the plate member 831 that is the undermost layer is removed from between the supporting base 85 and the plate member 832. The removed plate member 831 is transported to the outside of the vapor deposition chamber and cleaned to remove the vapor deposition material 95 that has adhered thereto. Furthermore, a clean plate member 831' in which the through hole H1, the through hole H2 and the through hole H3 are formed in the same arrangement as the plate member 831 is placed on the plate member 833 that is the uppermost layer.

Figure 16C:
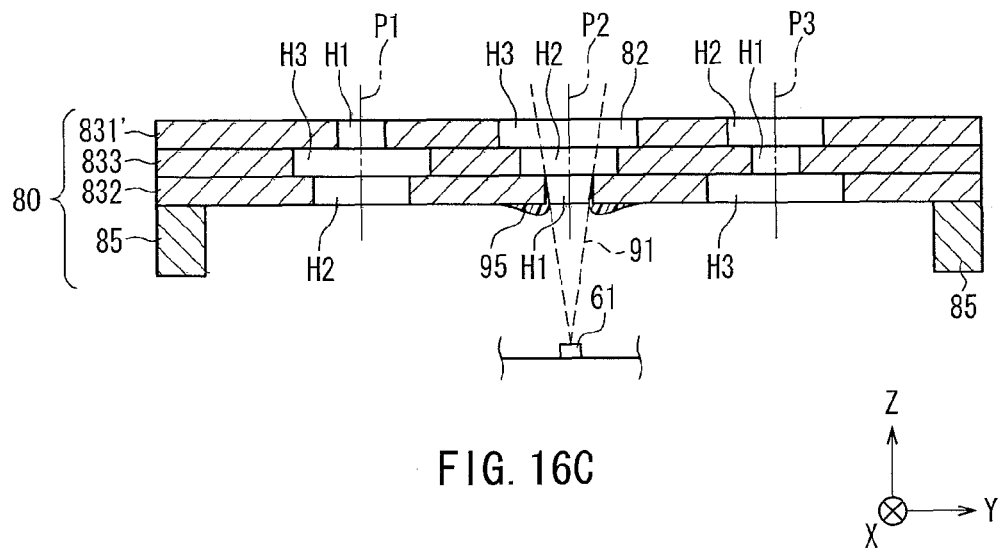
FIG. 16C is a diagram showing the procedure of replacing a plate member constituting the limiting unit, in the vapor deposition device according to Embodiment 3 of the present invention.

Next, as shown in FIG. 16C, the limiting unit 80 is moved in the Y axis direction so that the vapor deposition source opening 61 is disposed on the plane P2. Similarly to FIG. 16A, the through hole H1, the through hole H2 and the through hole H3 are disposed in this order from the bottom to the top above the vapor deposition source opening 61. In this state, the vapor deposition particles 91 are discharged from the vapor deposition source opening 61, and vapor deposition is re-started. The vapor deposition particles 91 pass through the through hole H1, the through hole H2 and the through hole H3 disposed on the plane P2 in this order, and adhere to the substrate 10 to form the coating film 90 (see FIGS. 5 and 6). The vapor deposition particles 91 discharged from the vapor deposition source opening 61 do not pass through the through holes H2, H3 and H1 disposed on the plane P1, nor the through holes H3, H1 and H2 disposed on the plane P3 to reach the substrate 10. The vapor deposition material 95 adheres to a portion in the vicinity of the through hole H1 and the inner circumferential surface of the through hole H1 on the lower surface (the surface facing the vapor deposition source opening 61) of the plate member 832 that is the undermost layer, over time.

If the vapor deposition material 95 having a predetermined thickness has adhered thereto, the vapor deposition is discontinued, as described in FIG. 16B, the plate member 832 that is the undermost layer is removed from between the supporting base 85 and the plate member 833, and a clean plate member 832' in which the through hole H1, the through hole H2 and the through hole H3 are formed in the same arrangement as the plate member 832 is placed on the plate member 831' that is the uppermost layer instead of the removed plate member. The removed plate member 832 is transported to the outside of the vapor deposition chamber and cleaned to remove the vapor deposition material 95 that has adhered thereto.

Figure 16D:
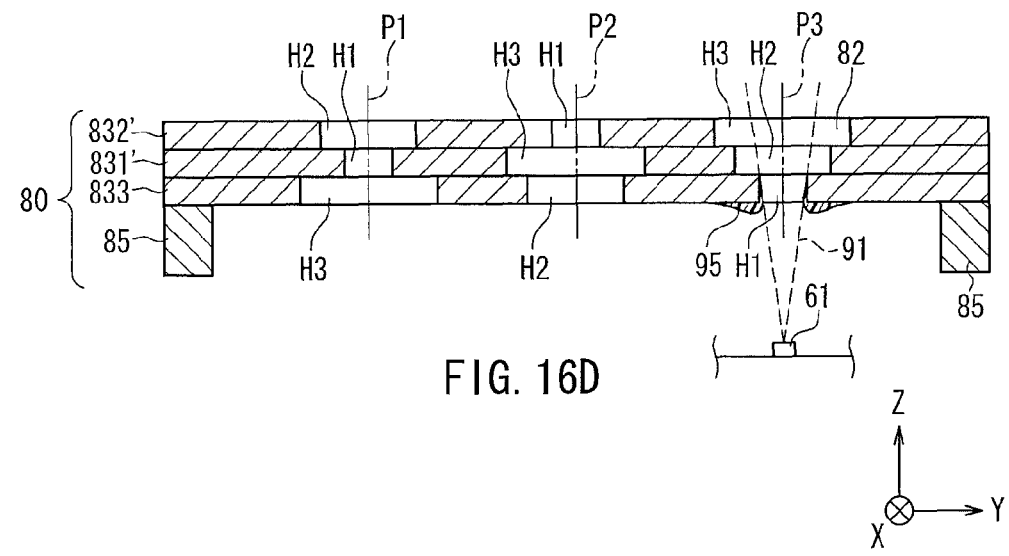
FIG. 16D is a diagram showing the procedure of replacing a plate member constituting the limiting unit, in the vapor deposition device according to Embodiment 3 of the present invention.

Next, as shown in FIG. 16D, the limiting unit 80 is moved in the Y axis direction so that the vapor deposition source opening 61 is disposed on the plane P3. Similarly to FIGS. 16A and 16C, the through hole H1, the through hole H2 and the through hole H3 are disposed in this order from the bottom to the top above the vapor deposition source opening 61. In this state, the vapor deposition particles 91 are discharged from the vapor deposition source opening 61, and vapor deposition is re-started. The vapor deposition particles 91 pass through the through hole H1, the through hole H2 and the through hole H3 disposed on the plane P3 in this order, and adhere to the substrate 10 to form the coating film 90 (see FIGS. 5 and 6). The vapor deposition particles 91 discharged from the vapor deposition source opening 61 do not pass through the through holes H3, H1 and H2 disposed on the plane P1, nor the through holes H2, H3 and H1 disposed on the plane P2 to reach the substrate 10. The vapor deposition material 95 adheres to a portion in the vicinity of the through hole H1 and the inner circumferential surface of the through hole H1 on the lower surface (the surface facing the vapor deposition source opening 61) of the plate member 833 that is the undermost layer, over time.

If the vapor deposition material 95 having a predetermined thickness has adhered thereto, the vapor deposition is discontinued, as described in FIG. 16B, the plate member 833 that is the undermost layer is removed from between the supporting base 85 and the plate member 831', and a clean plate member in which the through hole H1, the through hole H2 and the through hole H3 are formed in the same arrangement as the plate member 833 is placed on the plate member 832' that is the uppermost layer instead of the removed plate member. The removed plate member 833 is transported to the outside of the vapor deposition chamber and cleaned to remove the vapor deposition material 95 that has adhered thereto. Accordingly, the order of stacking plate members constituting the limiting unit 80 substantially returns to the above-described state of FIG. 16A. Subsequently, the above-described operations are repeated.

As described above, according to Embodiment 3, only the plate member that is the undermost layer to which the vapor deposition material 95 has adhered is removed, and a clean plate member in which through holes are formed in the same pattern as the removed plate member is stacked on the plate member that is the uppermost layer. Accordingly, similar effects to Embodiment 1 are achieved.

Furthermore, along with the above-described replacement of the plate member, the limiting unit 80 is moved relative to vapor deposition source opening 61 in Y axis direction such that the vapor deposition particles 91 that form a coating film on the substrate pass through the limiting opening 82 constituted by a plurality of types of through holes that are in communication so that the opening widths gradually increase from the side of the vapor deposition source opening toward the substrate 10. In other words, the limiting unit 80 is moved such that the vapor deposition particles 91 discharged from the vapor deposition source opening 61 always enter the through hole H1 having the smallest opening width, among three types of through holes H1, H2 and H3 formed in the plate member that is the undermost layer. Therefore, as described above, the vapor deposition material 95 adheres to the inner circumferential surface of the through hole H1 in addition to a portion in the vicinity of the through hole H1 on the lower surface (the surface facing the vapor deposition source opening 61) of the plate member that is the undermost layer.

The vapor deposition material 95 that has adhered to the inner circumferential surface of the through hole H1 may come off and fall, similarly to the vapor deposition material that has adhered to the lower surface of the plate member that is the undermost layer. Also, even in the case where the vapor deposition material does not come off, the vapor deposition material 95 that has adhered to the inner circumferential surface of the through hole H1 reduces the opening width of the through hole H1, the function of the limiting unit 80 limiting the incidence angles of the vapor deposition particles 91, and the function of capturing the vapor deposition particles 91 that collide with the inner circumferential surface.

According to Embodiment 3, a plate member that is the undermost layer is removed at the time of maintenance of the limiting unit 80, and therefore the state of the vapor deposition unit 80 is returned to a state in which the vapor deposition material has not adhered to not only the lower surface of the plate member that is the undermost layer but also the inner circumferential surface of the through hole H1 of the plate member that is the undermost layer. Therefore, the above-described problems resulting from the vapor deposition material 95 adhering to the inner circumferential surface of the through hole H1 can be solved.

It is preferable that in the above-described example, the opening widths of the through holes gradually increase from a lower layer toward an upper layer in the present embodiment. Accordingly, even if the vapor deposition material 95 adheres to the inner circumferential surface of the through hole of the plate member that is an higher layer than the plate member that is the undermost layer and comes off, the vapor deposition material that comes off falls and remains on the upper surface of the plate member that is a lower layer, and therefore there is little possibility that it falls on the vapor deposition source 60. Therefore, generally, there is little possibility that the vapor deposition material that falls is heated and re-vaporized.

It is more preferable that the opening widths of the through holes gradually increase from a lower layer toward an upper layer so that the vapor deposition material 95 does not adhere to the inner circumferential surface of the through hole of the plate member that is an higher layer than the plate member that is the undermost layer.

Although an example in which the limiting unit 80 is constituted by three plate members is shown in the above-described example, the number of plate members are not limited to three and needs only to be two or larger. The number of types of through holes having a different opening width is set to the same number as the number of plate members constituting the limiting unit 80.

Although the opening shape of the through hole is a substantially square in the above-described example, the present invention is not limited to this, and it may be, for example, a rectangle.

A plurality of types of through holes do not necessarily have different opening widths in both the X axis direction and the Y axis direction. In the present invention, as described in FIG. 10, generally, the vapor deposition material is likely to adhere to the inner circumferential surface (that is, the side surface 84 of the limiting portion 81) facing the X axis direction, and thus a plurality of types of through holes having a constant opening width in the Y axis direction and different opening width in the X axis direction may be formed in each plate member.

Although the position of the vapor deposition source opening 61 is fixed and the limiting unit 80 is moved in the Y axis direction in the above-described example, Embodiment 3 is not limited to this, and for example, the position of the limiting unit 80 may be fixed. In this case, at the time of maintenance of the limiting unit 80, the vapor deposition source 60 including the vapor deposition source openings 61 and the vapor deposition mask 70 needs only to be moved relative to the limiting unit 80 in the Y axis direction.

Although as in FIG. 14, the planes P1 to P3 are disposed at a fixed pitch in the Y axis direction in the above-described example, the present embodiment is not limited to this, and the planes can be disposed in the X axis direction. In this case, the arrangements of the through holes H1 to H3 and the movement direction of the limiting unit 80 are switched between the X axis and the Y axis. However, in this case, it is necessary to sufficiently take into consideration a design such that, for example, when the plane P1 is disposed above the vapor deposition source opening 60, the plane P2 and the plane P3 are disposed between the vapor deposition source openings 60 and the vapor deposition particles 91 do not pass through through holes other than the through holes on the plane P1 to reach the substrate 10. Thus, the above-described example is preferable in terms of design.

Similarly to Embodiment 2, also in Embodiment 3, after the vapor deposition material has adhered to both side surfaces of a plate member, the plate member may be removed from the vapor deposition chamber. In other words, in the case where the vapor deposition material has adhered to only the lower surface of the plate member that is the undermost layer, the plate member may be turned over and stacked on the plate member that is the uppermost layer. In the case where the vapor deposition material has adhered to the upper and lower surfaces of the plate member that is the undermost layer, the plate member that is the undermost layer is removed from the vapor deposition chamber, and a clean plate member in which through holes are formed in the same pattern as the removed plate member may be stacked on the plate member that is the uppermost layer. Accordingly, the frequency at which plate members are replaced can be reduced, and thus throughput of the device can be improved.

Embodiment 3 is the same as Embodiment 1 except for the above.

Embodiment 4

In Embodiments 1 and 2 described above, a plurality of plate members are stacked such that the edges of the plurality of through holes constituting the limiting opening 82 match. In contrast, in Embodiment 4, the plurality of plate members are caused to be positionally offset and stacked such that the edges of the plurality of through holes constituting the limiting opening 82 do not match.

Hereinafter, Embodiment 4 will now be described, focusing on differences from Embodiment 1. In diagrams referenced in the following description, the same reference numerals are given to components corresponding to the components described in Embodiment 1, and redundant description thereof will be omitted.

Figure 17A:
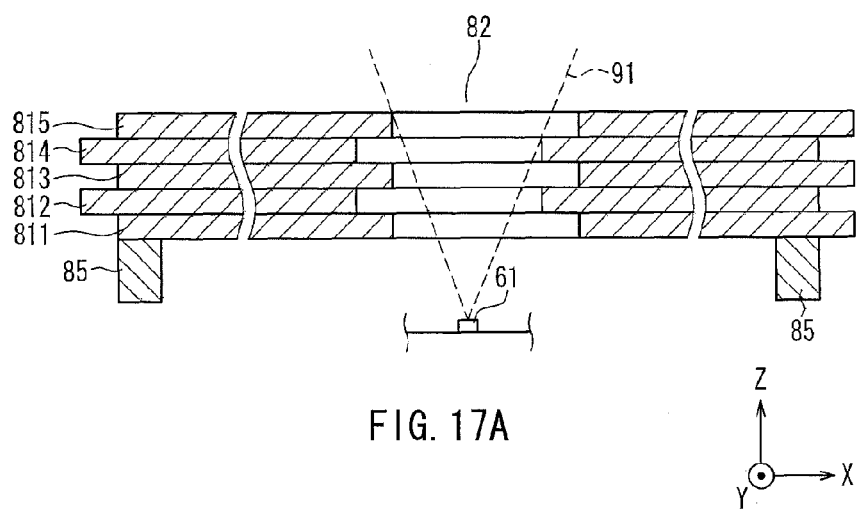
FIG. 17A is an enlarged cross-sectional view of one limiting opening of the limiting unit and the vicinity thereof, in a vapor deposition device according to Embodiment 4 of the present invention.

FIG. 17A is an enlarged cross-sectional view of one limiting opening 82 of the limiting unit 80 and the vicinity thereof in a vapor deposition device according to Embodiment 4.

The limiting unit 80 includes five plate members 811 to 815 stacked in the Z axis direction and having the same shape and the same dimension. The odd numbered plate members 811, 813 and 815 are positionally offset with respect to the even numbered plate members 812 and 814 in the X axis direction and Y axis direction. The flow of the vapor deposition particles 91 that are discharged from the vapor deposition source opening 61 and are capable of passing through the limiting opening 82 of the limiting unit 80 is defined by the edge of the through hole of the plate member 815 that is the uppermost layer and the edge of the through hole of the plate member 814 that is the second layer from the top.

Figure 17B:
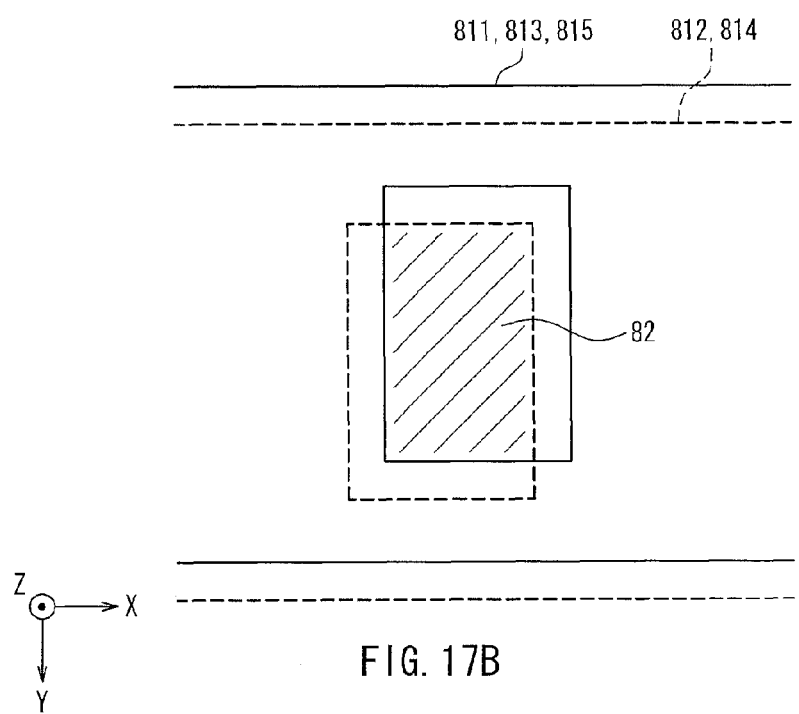
FIG. 17B is an enlarged plan view of one limiting opening of the limiting unit and the vicinity thereof, in the vapor deposition device according to Embodiment 4 of the present invention.

FIG. 17B is an enlarged plan view of the limiting opening 82 and the vicinity thereof. The solid lines indicate the odd numbered plate members 811, 813 and 815 and the dashed lines indicate the even numbered plate members 812 and 814. A hatched region is an effective region of the limiting opening 82 where the vapor deposition particles can pass through.

According to Embodiment 4, the size and the shape of the effective region of the limiting opening 82 can be arbitrarily changed by changing the amount of positional offset and the direction of positional offset among the plurality of plate members constituting the limiting unit 80. The size of the effective region of the limiting opening 82 can be adjusted within a range of the size of the through hole formed in the plate member or less. For example, in the case where the pattern of the coating film 90 that is formed on the substrate 10 is changed, the effective region of the limiting opening 82 of the limiting unit 80 may need to be changed in correspondence with the change. In such a case, with Embodiment 4, the effective region of the limiting opening 82 can be changed by only changing the relative positions among the plurality of plate members, without replacing the plurality of plate members constituting the limiting unit 80. Therefore, the need to prepare a plate member whose specification is different in each pattern of the coating film 90 is eliminated, and therefore the cost for producing the plate member can be reduced, and moreover a large space for storing various types of plate members is not required.

As shown in FIG. 17A, unevenness is formed on the inner circumferential surfaces defining the limiting opening 82 by positionally offsetting the plurality of plate members from one another. The vapor deposition material is likely to adhere to a protruded portion of the inner circumferential surfaces but is unlikely to adhere to a recessed portion thereof. Therefore, for example, in the case where a large amount of vapor deposition material has adhered to the protruded portion, thereafter, by changing the relative positions among the plurality of plate members such that the protruded portion becomes a recessed portion, it is possible to prevent the vapor deposition material from further adhering to the protruded portion and from coming off and falling. As a result, the frequency at which plate members are replaced can be reduced.

In FIG. 17A, the vapor deposition device of the present embodiment may be disposed such that the Z axis direction is a horizontal direction. In this case, even if the vapor deposition material that has adhered to the protruded portions of the inner circumferential surfaces of the limiting opening 82 comes off and falls, the vapor deposition material falls in and is captured by a recessed portion facing a protruded portion in the vertical direction. Therefore, it is possible to prevent the vapor deposition material that comes off from contaminating the inside of the vapor deposition device. Also, the vapor deposition material captured in the recessed portion does not reduce the opening width of the limiting opening 82.

In the above-described example, a portion of the plurality of plate members is positionally offset in both the X axis direction and the Y axis direction with respect to the remaining portion. In this case, the amount of positional offset in the X axis direction and the amount of positional offset in the Y axis direction may be the same or different. In other words, a direction of positional offset can be arbitrarily set on the XY plane. For example, a portion of plate members may be positionally offset in either one of the X axis direction and the Y axis direction.

Although among the plurality of plate members, the odd numbered plate members are positionally offset with respect to the even numbered plate members in the above-described example, it is not necessary for the plurality of plate members to be positionally offset alternatively one by one. For example, every two neighboring plate members may be positionally offset alternatively. Alternatively, one arbitrary plate member or a plurality of plate members (for example, the plate member that is the uppermost layer and/or the plate member that is the undermost layer) among the plurality of plate members may be positionally offset with respect to the other.

In the above-described example, the positions of the odd numbered plate members and the positions of the even numbered plate members are respectively the same. In other words, the number of types of positions at which plate members are disposed is two. However, the plate members may be disposed at three types of different positions or more.

Embodiment 4 is the same as Embodiments 1 and 2 except for the above. The maintenance of the limiting unit 80 performed when the vapor deposition material has adhered to the plate member can be performed similarly to Embodiments 1 and 2.

Embodiment 5

Hereinafter, Embodiment 5 will now be described, focusing on differences from Embodiment 1. In diagrams referenced in the following description, the same reference numerals are given to components corresponding to the components described in Embodiment 1, and redundant description thereof will be omitted.

Figure 18:
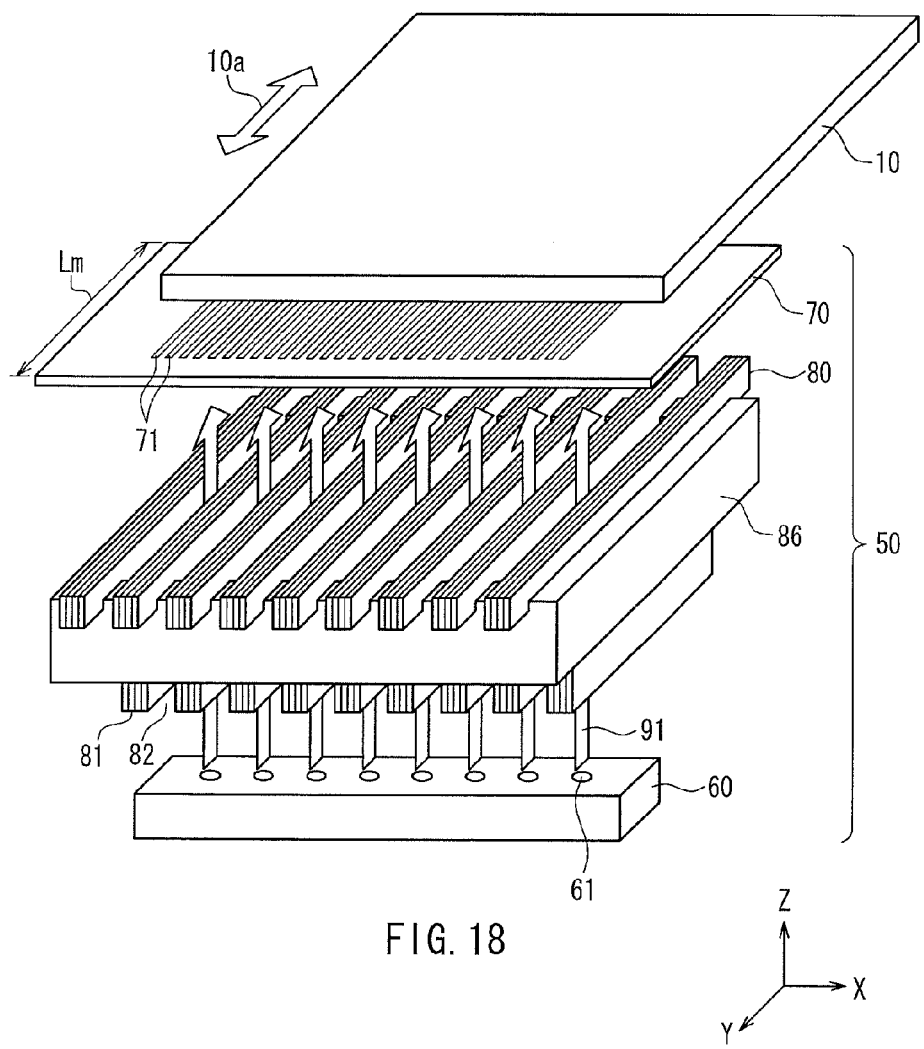
FIG. 18 is a perspective view showing the basic configuration of a vapor deposition device according to Embodiment 5 of the present invention.
Figure 19:
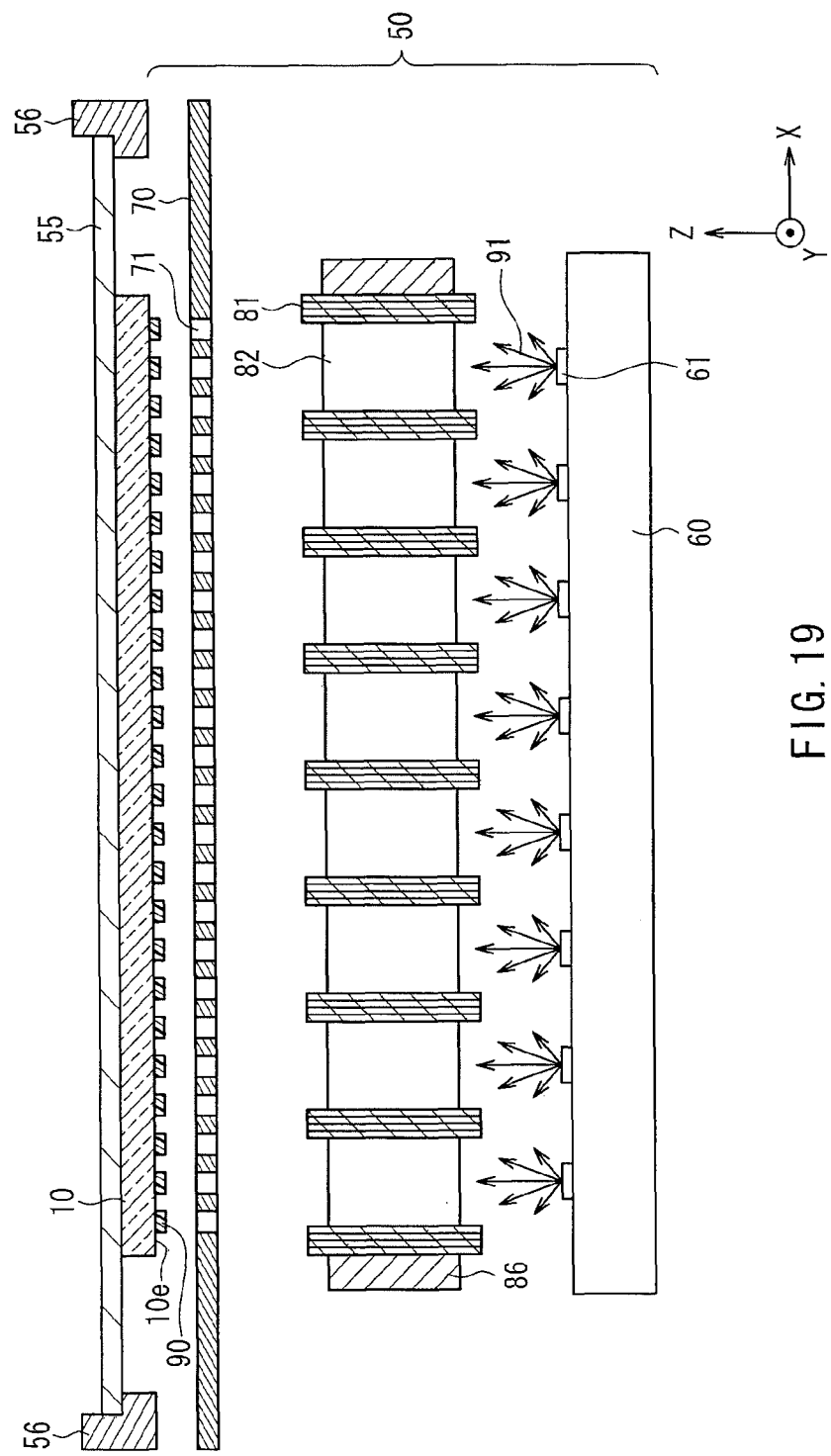
FIG. 19 is a front-cross sectional view of the vapor deposition device shown in FIG. 18, along a plane that is perpendicular to the traveling direction of the substrate and passes across vapor deposition source openings.

FIG. 18 is a perspective view showing the basic configuration of a vapor deposition device according to Embodiment 5 of the present invention. FIG. 19 is a front cross-sectional view of the vapor deposition device shown in FIG. 18, along a plane passing across the vapor deposition source 60. The vapor deposition source of Embodiment 5 is different from the vapor deposition device of Embodiment 1, in terms of the configuration of the limiting unit 80.

The limiting portion 81 of the limiting unit 80 is constituted by a plurality of plate members stacked in the Z axis direction in Embodiment 1, whereas it is constituted by a plurality of plate members (in the present example, four) stacked in the X axis direction in Embodiment 5. The plurality of plate members are engaged with a frame-shaped supporting base 86 whose shape is a substantially rectangle as viewed in the Z axis direction. The plurality of limiting portions 81 are disposed in the X axis direction at a fixed pitch. A through hole that is formed between limiting portions neighboring in the X axis direction and penetrates in the Z axis direction constitutes a limiting opening 82 through which the vapor deposition particles 91 pass.

Figure 20:
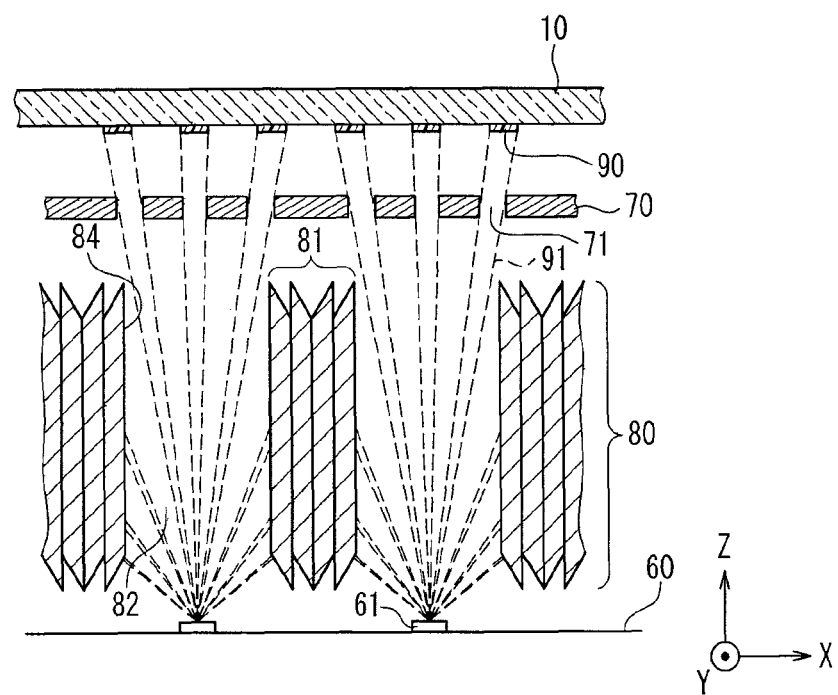
FIG. 20 is a cross-sectional view along a plane orthogonal to the movement direction of the substrate showing how a coating film is formed on the substrate in the vapor deposition device according to Embodiment 5 of the present invention.

FIG. 20 is a cross-sectional view showing how a coating film 90 is formed on the substrate 10 in Embodiment 5, along a plane parallel to the XZ plane. Similarly to the limiting portion 81 of Embodiment 1 (see FIG. 9), the limiting portion 81 of Embodiment 5 limits the incidence angles of the vapor deposition particles 91 in the X axis direction entering the mask opening 71 (or the substrate 10). In Embodiment 5, the limiting portion 81 is constituted by a plurality of plate members stacked in the X axis direction. Therefore, as compared with Embodiment 1, the aspect ratio of the limiting opening 82 (=the dimension of the limiting portion 81 in the Z axis direction/the distance in the X axis direction between limiting portions 81 neighboring in the X axis direction) can be easily increased. As a result, the present embodiment is effective in reducing the incidence angles of the vapor deposition particles 91 in the X axis direction entering the mask opening 71.

Figure 21A:
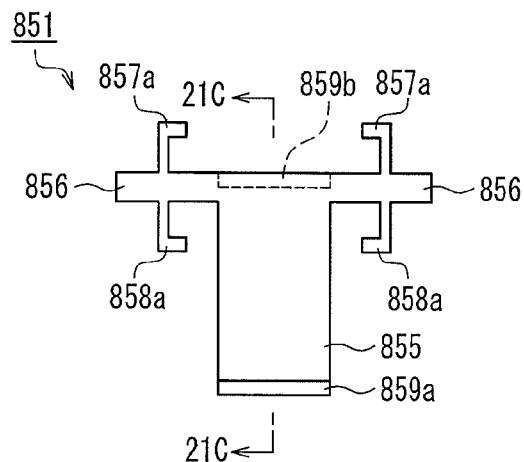
FIG. 21A is a plan view of a first plate member constituting a limiting unit, in a vapor deposition device according to Embodiment 5 of the present invention.
Figure 21B:
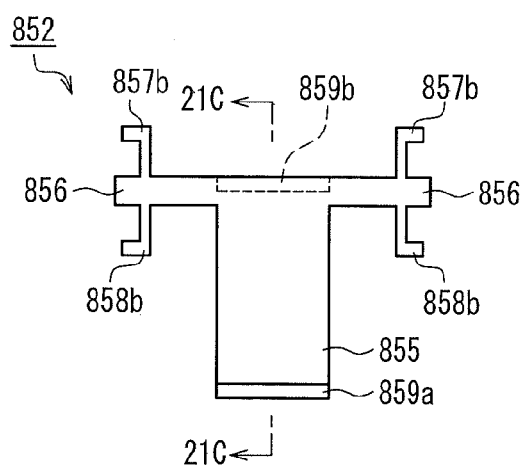
FIG. 21B is a plan view of a second plate member constituting the limiting unit, in the vapor deposition device according to Embodiment 5 of the present invention.
Figure 21C:
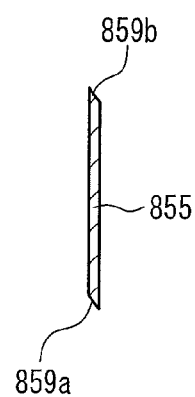
FIG. 21C is a vertical cross-sectional view of the first plate member and the second plate member taken on a plane along the 21C-21C of FIGS. 21A and 21B.

In the present example, the limiting portion 81 is constituted by four plate members having the same thickness. Four plate members are constituted by a pair of first plate members 851 and a pair of second plate members 852 FIG. 21A is a plan view of the first plate member 851 and FIG. 21B is a plan view of the second plate member 852. FIG. 21C is a vertical cross-sectional view of the first plate member 851 and the second plate member 852, taken on a plane along the line 21C-21C of FIGS. 21A and 21B. Both the first plate member 851 and the second plate member 852 have a main portion 855 having a substantially rectangular thin plate shape. A first inclined face 859a and a second inclined face 859b are formed on a pair of sides (in the present example, short sides) of the main portion 855 that face each other. As shown in FIG. 21C, the first inclined face 859a and the second inclined face 859b are formed on surfaces of the main portion 855 on opposite sides.

A side of the main portion 855 on which the second inclined face 859b is formed is extended so as to protrude outwardly on both sides, and a pair of arms 856 are formed thereon.

A first hook 857a that protrudes upwardly (the opposite side from the main portion 855) and a second hook 858a that protrudes downwardly (the same side as the main portion 855) are formed in each arm 856 of the first plate member 851. The first hooks 857a and the second hooks 858a respectively formed on the pair of arms 856 face each other.

A first hook 857b that protrudes upwardly (the opposite side from the main portion 855) and a second hook 858b that protrudes downwardly (the same side as the main portion 855) are formed in each arm 856 of the second plate member 852. The first hooks 857b and the second hooks 858b respectively formed on the pair of arms 856 face opposite sides.

The first plate member 851 and the second plate member 852 are the same, except for the first hooks 857a and 857b and the second hooks 858a and 858b.

Figure 22:
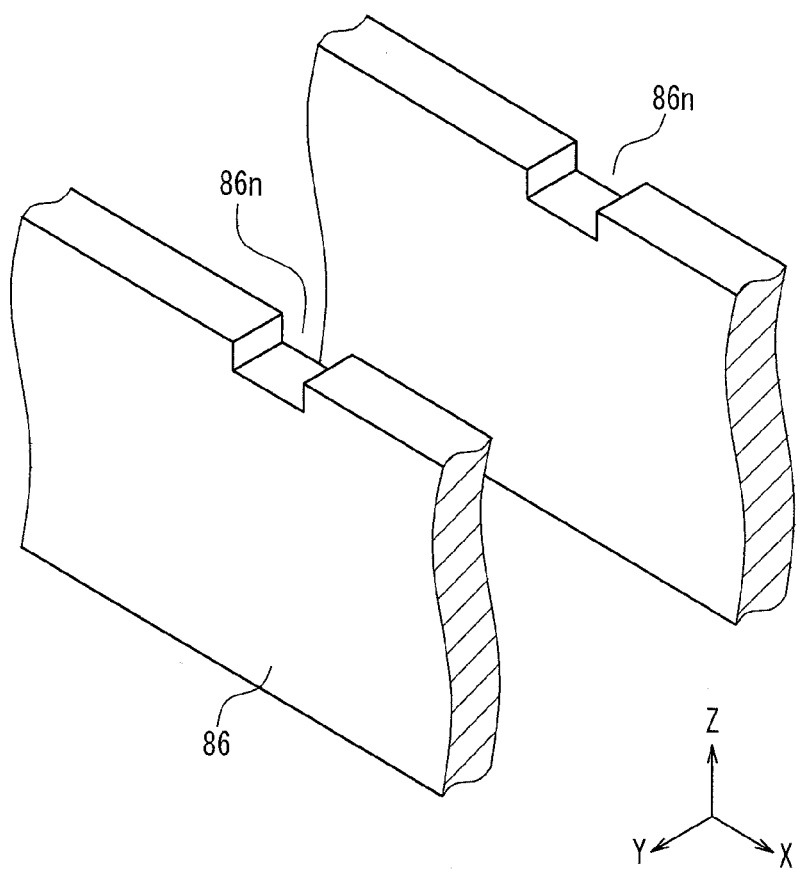
FIG. 22 is an enlarged perspective view showing a notch formed on a supporting base in order to hold a limiting portion at a predetermined position, in the limiting unit of the vapor deposition device according to Embodiment 5 of the present invention.

FIG. 22 is an enlarged perspective view showing a portion of an upper end surface of the supporting base 86. A notch 86n is respectively formed on the upper end surfaces of a pair of side walls of the supporting bases 86 extending parallel to the X axis. A pair of the first plate members 851 and a pair of the second plate member 852 are overlaid (that is, brought into contact with each other), and these arms 856 are fitted into the notches 86n. Accordingly, the first and second plate members 851 and 852 are suspended from and held by the supporting base 86. The dimensions of the notch 86n in the X axis direction substantially match the total thickness of a pair of the first plate members 851 and a pair of the second plate members 852 that are stacked. Therefore, the pair of the first plate members 851 and the pair of the second plate members 852 held by the supporting base 86 in the above-described manner are in close contact and are positioned in the X axis direction.

Figure 23A:
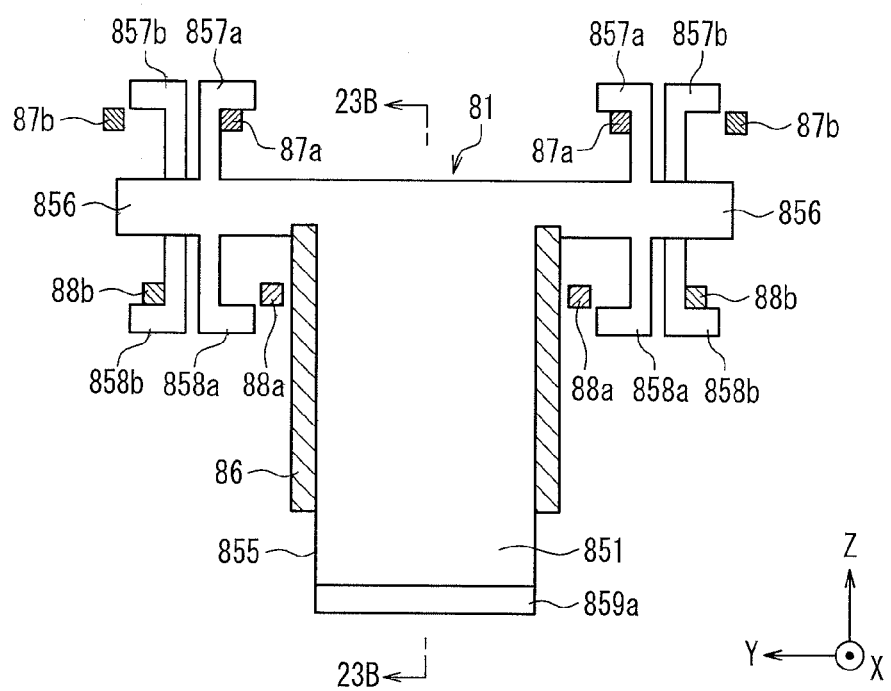
FIG. 23A is a front view of a limiting portion held by the supporting base in the limiting unit of the vapor deposition device according to Embodiment 5 of the present invention.
Figure 23B:
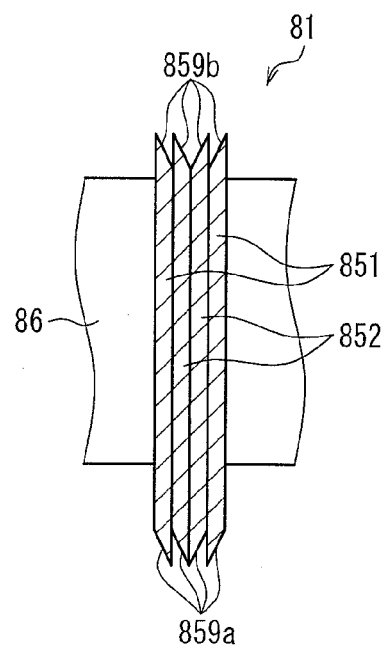
FIG. 23B is a vertical cross-sectional view of the limiting portion taken on a plane along the line 23B-23B of FIG. 23A.

FIG. 23A is a front-sectional view of the limiting portion 81 held by the supporting base 86. FIG. 23B is a vertical cross-sectional view of the limiting portion 81, taken on a plane along the line 23B-23B of FIG. 23A. As shown in FIG. 23A, the first hook 857a and the second hook 858a of the first plate member 851 and the first hook 857b and the second hook 858b of the second plate member 852 are disposed at different positions, as viewed along a direction parallel to the X axis. As shown in FIG. 23B, a pair of the second plate members 852 are overlaid such that the surfaces on which the second inclined faces 859b are formed are in contact with each other, and a pair of the first plate members 851 are respectively overlaid on both outer sides thereof such that the surfaces on which the second inclined faces 859b are formed are in contact with the second plate members 852.

In FIG. 23A, reference numerals 87a and 87b denote lifting bars and reference numerals 88a and 88b denote fixing bars. Both the lifting bars 87a and 87b and the fixing bars 88a and 88b are stick-shaped members extending parallel to the X axis. The lifting bars 87a and 87b are respectively disposed above the arms 856 as pairs, and the fixing bars 88a and 88b are respectively disposed below the arms 856 as pairs.

A pair of the lifting bars 87a are disposed between a pair of the lifting bars 87b. In FIG. 23A, the pair of the lifting bar 87a and the lifting bar 87b disposed on the right side and the pair of the lifting bar 87a and the lifting bar 87b disposed on the left side are capable of integrally moving reciprocally in the Y axis direction and integrally raising and lowering in the Z axis direction with their respective spacing therebetween being kept constant. In the state of FIG. 23A, the pair of the lifting bars 87a are engaged with the pair of the first hooks 857a of the first plate member 851. The pair of the lifting bars 87b can be engaged with the pair of the first hooks 857b of the second plate members 852 by moving the lifting bars 87a and 87b in the Y axis direction from this state. In this manner, either one of the engagement between the pair of the lifting bars 87a and the pair of the first hooks 857a and the engagement between the pair of the lifting bars 87b and the pair of the first hooks 857b can be performed in an alternative manner by integrally moving reciprocally in the Y axis direction the lifting bars 87a and 87b. Furthermore, the lifting bars 87a and 87b can be moved up from the position of FIG. 23A in the Z axis direction while maintaining such an alternative engagement state.

A pair of the fixed bars 88a are disposed between a pair of the fixing bars 88b. In FIG. 23A, the pair of the fixing bar 88a and the fixing bar 88b disposed on the right side and the pair of the fixing bar 88a and the fixing bar 88b disposed on the left side are capable of integrally moving reciprocally in the Y axis direction with their respective spacing therebetween being kept constant. In the state of FIG. 23A, the pair of the fixing bars 88a are engaged with the pair of the second hooks 858b of the second plate member 852. The pair of the fixing bars 88a can be engaged with the pair of the second hooks 858a of the first plate members 851 by moving the fixing bars 88a and 88b from this state in the Y axis direction so as to be apart from the main portion 855. In this manner, either one of the engagement between the pair of the fixing bars 88a and the pair of the second hooks 858a and the engagement between the pair of the fixing bars 88b and the pair of the second hooks 858b can be performed in an alternative manner by integrally moving reciprocally in the Y axis direction the fixing bars 88a and 88b.

Figure 24:
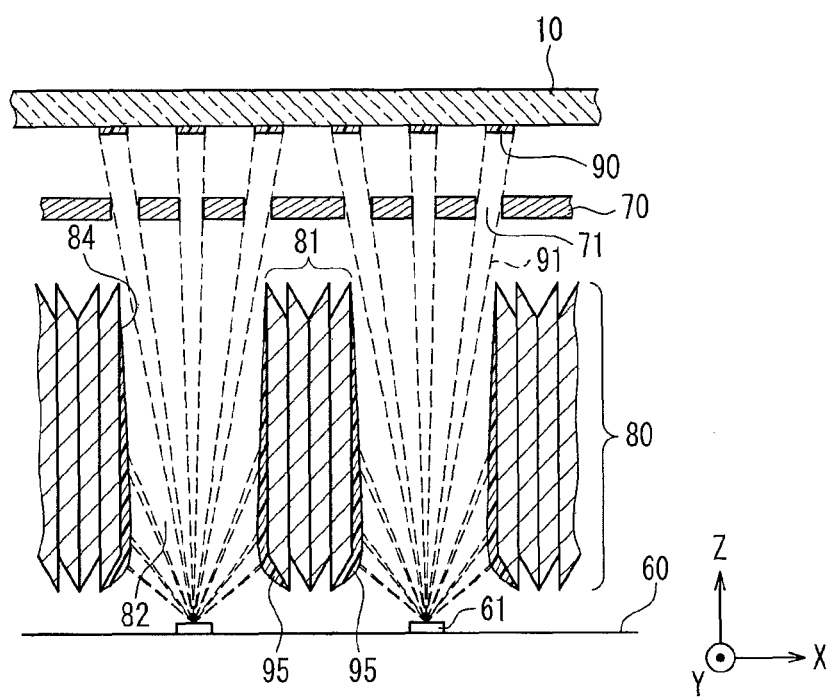
FIG. 24 is a cross-sectional view showing a state in which the vapor deposition material has adhered to the limiting portions of the limiting unit, in the vapor deposition device according to Embodiment 5 of the present invention.

Similarly to Embodiment 1, also in the present embodiment, if the coating film 90 is continuously formed on the substrate 10 for a long period of time, the vapor deposition particles 91 are captured by and accumulate on the limiting portion 81, as a result of which the vapor deposition material 95 adheres to the limiting portions 81 as shown in FIG. 24. Generally, the vapor deposition material 95 adheres to an outer surface of the plate member (a plate member that is the outermost layer) disposed on the most outer side in the X axis direction among the plurality of plate members constituting the limiting portion 81, although depending on the relative positional relationship between the vapor deposition source openings 61 and the limiting portions 81. As described above, the aspect ratio of the limiting opening 82 can be increased in Embodiment 5. Therefore, the distance in the Z axis direction between the limiting portion 81 and the vapor deposition source opening 61 can be reduced. As a result, the amount of the vapor deposition material that adheres to the plate members other than the outermost layer among the plurality of plate members constituting the limiting portion 81 can be reduced.

If the amount of vapor deposition material 95 adhering to the limiting portion 81 increases, the vapor deposition material 95 comes off and falls, and contaminates the inside of the vapor deposition device. If the vapor deposition material 95 that comes off falls on the vapor deposition source 60, the vapor deposition material is heated and re-vaporized, and adheres to the substrate 10 at an undesired position, as a result of which the yield is reduced. Also, if the vapor deposition material that comes off falls on the vapor deposition source openings 61, the vapor deposition source openings 61 become blocked with the vapor deposition material, and the coating film 90 cannot be formed at a desired position on the substrate 10.

Also, if the vapor deposition material 95 adheres to the plate member that is the outermost layer among the plurality of plate members constituting the limiting portion 81, the distance between limiting portions 81 neighboring in the X axis direction is reduced, and the function of the limiting unit 80 limiting the incidence angles of the vapor deposition particles is reduced and the function of capturing the vapor deposition particles 91 that collide with the plate member that is the outermost layer is reduced.

Therefore, it is necessary to regularly perform maintenance of the limiting unit 80 so as to prevent the amount of vapor deposition material 95 adhering thereto from exceeding a predetermined amount.

Hereinafter, a maintenance method for the limiting unit 80 in the vapor deposition device according to Embodiment 5 will now be described.

If the vapor deposition material 95 having a predetermined thickness has adhered to the first plate member 851 that is the outermost layer, vapor deposition is discontinued. As shown in FIG. 23A, the pair of the lifting bars 87*a* are then engaged with the pair of the first hooks 857*a* of the first plate member 851, and the pair of the fixing bars 88*b* are engaged with the pair of the second hooks 858*b* of the second plate member 852. In this state, the lifting bars 87*a* and 87*b* are moved up.

Figure 25A:
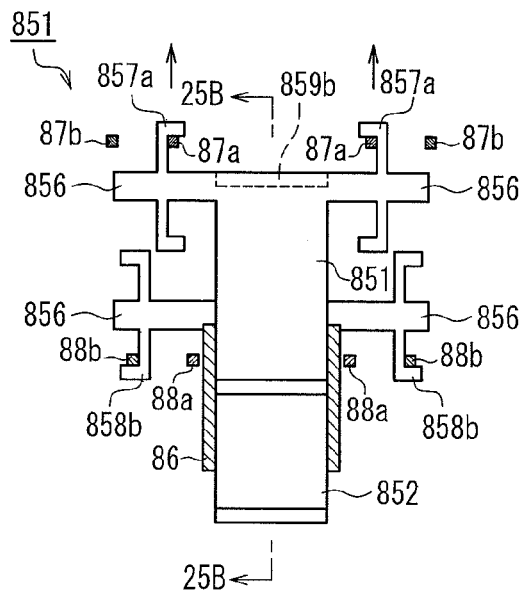
FIG. 25A is a front view showing one step of replacing a plate member constituting the limiting unit, in the vapor deposition device according to Embodiment 5 of the present invention.
Figure 25B:
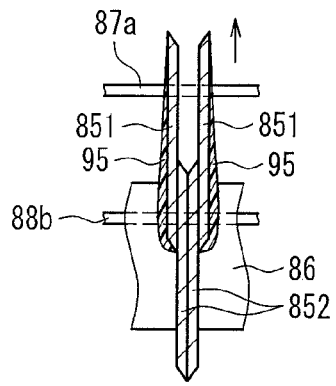
FIG. 25B is a vertical cross-sectional view of the limiting portion taken on a plane along the line 25B-25B of FIG. 25A.

FIG. 25A is a front view showing a state in which the lifting bars 87*a* and 87*b* are moved halfway up, and FIG. 25B is a vertical cross-sectional view taken on a plane along the line 25B-25B. The lifting bars 87*a* are engaged with the first hooks 857*a* of a pair of the first plate members 851 constituting both outermost layers of the limiting portion 81. On the other hand, the fixing bars 88*b* are engaged with the second hooks 858*b* of a pair of the second plate members 852 located between the pair of the first plate members 851. Therefore, the pair of the second plate members 852 do not move, and only the pair of the first plate members 851 move up along with the lifting bars 87*a* and 87*b*. The pair of the first plate members 851 separated from the pair of the second plate members 852 are transported to the outside of the vapor deposition chamber and cleaned so as to remove the vapor deposition material 95 that has adhered thereto. The vapor deposition material 95 may be recovered and re-used as necessary.

Figure 26A:
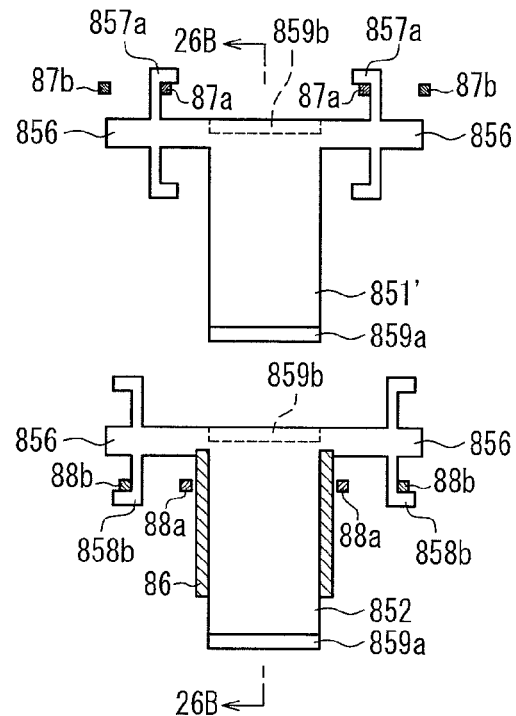
FIG. 26A is a front view showing one step of replacing a plate member constituting the limiting unit, in the vapor deposition device according to Embodiment 5 of the present invention.
Figure 26B:
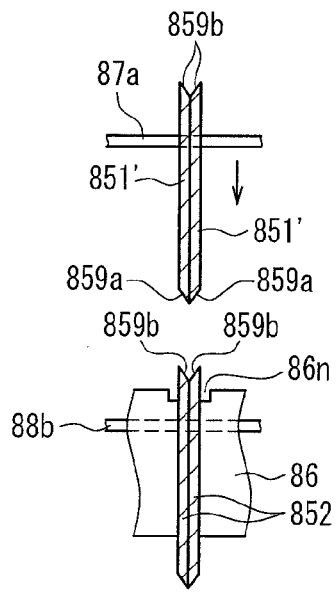
FIG. 26B is a vertical cross-sectional view of the limiting portion taken on a plane along the line 26B-26B of FIG. 26A.

Next, as shown in FIGS. 26A and 26B, a pair of clean first plate members 851' are engaged with the lifting bars 87*a* with the first hooks 857*a*, instead of the pair of the first plate members 851 removed in FIGS. 25A and 25B. The first plate members 851' are the same as the first plate members 851 shown in FIG. 21A. As shown in FIG. 26B, the pair of the first plate members 851' are overlaid such that the surfaces on which the second inclined faces 859*b* are formed are in contact with each other. Thus, the inclined faces 859*a* formed on the lower ends of the pair of the first plate members 851' are combined to form a wedge shape that becomes thinner toward the lower side. In this state, the lifting bars 87*a* and 87*b* are moved down. The above-described wedge shape formed by the inclined faces 859*a* of the pair of the first plate members 851' is inserted into a recessed portion formed by combining the inclined faces 859*b* of the pair of the second plate members 852 and having a V-shaped cross section. As a result, the pair of the second plate members 852 that are in contact with each other are spaced apart, and the pair of the first plate members 851' advance therebetween. The pair of the first plate members 851' are pushed downwardly between the pair of the second plate members 852 until the arms 856 of the pair of the first plate members 851' are fitted into the notches 86*n* of the supporting base 86.

Figure 27A:
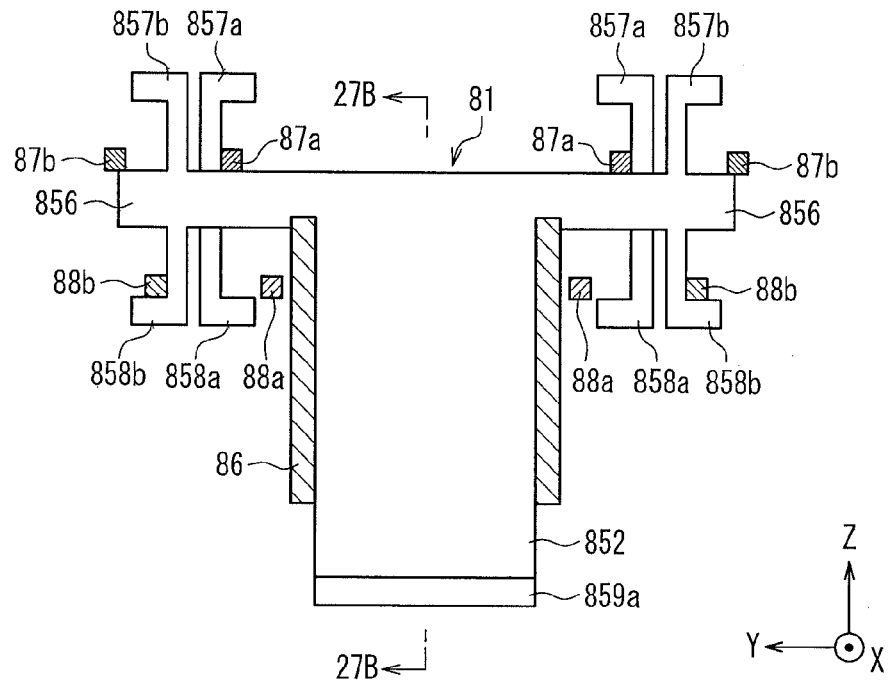
FIG. 27A is a front view showing one step of replacing a plate member constituting the limiting unit, in the vapor deposition device according to Embodiment 5 of the present invention.
Figure 27B:
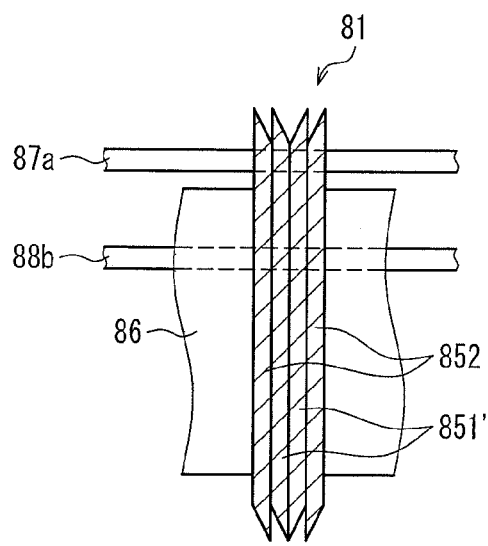
FIG. 27B is a vertical cross-sectional view of the limiting portion taken on a plane along the line 27B-27B of FIG. 27A.

In this manner, as shown in FIGS. 27A and 27B, the limiting portion 81 is formed in which the pair of the first plate members 851' are overlaid so as to be contact with each other, and the pair of the second plate members 852 are overlaid on both outer sides thereof so as to be in contact with the first plate members 851'. The limiting portion 81 is accurately positioned in the X axis direction by the notches 86*n*.

This ends the maintenance of the limiting unit 80. Thereafter, vapor deposition is re-started.

If the vapor deposition material 95 having a predetermined thickness has adhered to the second plate member 852 that is the outermost layer, vapor deposition is discontinued. At this case, the pair of the lifting bars 87*b* are engaged with the pair of the first hooks 857*b* of the second plate members 852, and the pair of the fixing bars 88*a* are engaged with the pair of the second hooks 858*a* of the first plate members 851'. In this state, the lifting bars 87*a* and 87*b* are moved up. Hereinafter, similar operations are performed as described above, the pair of the second plate members 852 to which the vapor deposition material has adhered are removed, a pair of clean second plate members are inserted between the pair of the first plate members 851', instead of the removed plate members.

As described above, according to Embodiment 5, the limiting portion 81 is constituted by a plurality of plate members stacked in the X axis direction, and therefore the maintenance of the limiting unit 80 is completed by only removing a pair of plate members that are the outermost layers to which the vapor deposition material 95 has adhered and inserting a pair of clean plate members between the remaining plate members.

The plate member is thin and light in weight, and therefore it is not necessary for the lifting bars 87*a* and 87*b* and the fixing bars 88*a* and 88*b* that are used at the time of replacement to have a high load-carrying capacity. Therefore, it is possible to reduce an increase in the cost of vapor deposition equipment.

Also, a thin and lightweight plate member needs only to be transported by using simple lifting bars 87*a* and 87*b*, and therefore it is not necessary to return the pressure inside the vapor deposition chamber 100 to atmospheric pressure by opening the vapor deposition chamber 100 for replacing the plate member. Therefore, the need to stop vapor deposition for a long period of time in order for maintenance of the limiting unit 80 (that is, replacement of the plate member) is eliminated, and therefore the throughput of the vapor deposition device is improved.

Furthermore, the operation for removing the vapor deposition material that has adhered to a thin and lightweight plate member is easily performed.

Similarly to Embodiment 2, also in Embodiment 5, a plate member of which the vapor deposition material has adhered to one side surface may be re-used, and the plate member can be removed from the vapor deposition chamber after the vapor deposition material has adhered to both side surfaces of the plate member and a clean plate member may be inserted instead of the removed plate member. For example, in the case where the vapor deposition material 95 has adhered to only one side surface of each of the pair of plate members 851 that are the outermost layers as in FIGS. 25A and 25B, the plate members 851 are overlaid so that the surfaces to which the vapor deposition material 95 has adhered are in contact with each other, and the overlaid plate members 851 are inserted between a pair of the plate members 852, similarly to FIGS. 26A and 26B. Accordingly, similar effects described in Embodiment 2 are achieved. However, in the case where the surfaces to which the vapor deposition material 95 has adhered are overlaid so as to be in contact with each other, it is necessary to form second inclined faces 859b on both side surfaces of the main portion 855 and to make the cross-sectional shape of the plate members be a W-shape, or the like in order to make the overlaid plate members operate similarly to FIGS. 26 and 26B.

Although the limiting portion 81 is constituted by four plate members in the above-described example, the number of plate members constituting the limiting portion 81 needs only to be even number, and can be set arbitrarily. The maintenance of the limiting unit 80 is completed by removing a pair of the plate members that are the outermost layers to which the vapor deposition material 95 has adhered and inserting a pair of clean plate members into the middle of the remaining plate members, regardless of the number of plate members constituting the limiting portion 81.

The position at which a pair of plate members are inserted is not necessarily the exact center of a plurality of plate members, and may be an arbitrary position other than the outermost layer.

A mechanism for selectively removing only plate members that are the outermost layers among a plurality of plate members constituting the limiting portion 81, and a mechanism for inserting clean plate members into between a plurality of plate members are not limited to the above-described example, and can be freely changed.

Embodiments 1 to 5 described above are merely examples. The present invention is not limited to Embodiments 1 to 5 described above, and can be changed as appropriate.

The shapes of the vapor deposition source openings of the vapor deposition source 60 can be set to any arbitrary shape. For example, the vapor deposition source openings may have a slot shape extending along the X axis direction, instead of a nozzle shape shown in Embodiments 1 to 5. In this case, the opening dimension of the vapor deposition source opening having a slot shape in the X axis direction may be larger than the pitch of the limiting opening 82 in the X axis direction.

If the substrate 10 has a large dimension in the X axis direction, a plurality of vapor deposition units 50 as shown in the above-described embodiments may be arranged at different positions in the X axis direction and in the Y axis direction.

In Embodiments 1 to 5 described above, the substrate 10 is moved relative to the vapor deposition unit 50 that is stationary, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In Embodiments 1 to 5 described above, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

In Embodiments 1 to 5 described above, a case where a light emitting layer for an organic EL element is formed is described as an example, but the present invention is not limited thereto. For example, the present invention can be used for a case where the thickness of layers other than the light emitting layer for an organic EL element is changed for each color in order to match the current-voltage characteristics for each color, adjust an emission spectrum by a microcavity effect, or the like. Furthermore, the present invention can be used for a case where various types of thin films other than a thin film constituting an organic EL element are formed by a vapor deposition method.

INDUSTRIAL APPLICABILITY

There is no particular limitation on the fields to which the present invention can be applied, and the present invention is preferably used to form light emitting layers for use in organic EL display devices.

DESCRIPTION OF SYMBOLS

10 Substrate
10a First Direction (Movement Direction of Substrate)
10e Deposition Surface
20 Organic EL Element
23R, 23G, 23B Light Emitting Layer
50 Vapor Deposition Unit
56 Moving Mechanism
60 Vapor Deposition Source
61 Vapor Deposition Source Opening
70 Vapor Deposition Mask
71 Mask Opening
80 Limiting Unit
81 Limiting Portion
82 Limiting Opening
83 Lower Surface of Limiting Portion
85,86 Supporting Base
90 Coating Film
90e Blurred Portion
90m Coating Film Main Portion
91 Vapor Deposition Particles
100 Vapor Deposition Chamber
811,812,813,814,815 Plate Member
831,832,833 Plate Member
851,852 Plate Member

The invention claimed is:

1. A vapor deposition device that forms a coating film having a predetermined pattern on a substrate the vapor deposition device comprising:

a vapor deposition unit including a vapor deposition source having at least one vapor deposition source opening, a vapor deposition mask disposed between the at least one vapor deposition source opening and the substrate, and a limiting unit that is disposed between the at least one vapor deposition source opening and the vapor deposition mask and in which a plurality of limiting portions are disposed along a first direction that is orthogonal to a normal line direction of the substrate; and a moving mechanism that moves one of the substrate and the vapor deposition unit relative to the other along a second direction that is orthogonal to the normal line direction of the substrate and the first direction, in a state in which the substrate and the vapor deposition mask are spaced apart at a fixed spacing, wherein the coating film is formed by causing vapor deposition particles discharged from the at least one vapor deposition source opening and passing through a plurality of limiting openings separated by the plurality of limiting portions and a plurality of mask openings formed in the vapor deposition mask to adhere onto the substrate, the limiting unit includes a plurality of plate members that are stacked on one another, the plurality of plate members are stacked in the normal line direction of the substrate,
a plurality of through holes constituting the plurality of limiting openings are formed in each of the plurality of plate members,
the plurality of through holes formed in each of the plurality of plate members include a plurality of types of through holes having different opening widths, and
the plurality of types of through holes having different opening widths are in communication in the normal line direction of the substrate to constitute the plurality of limiting openings.

2. The vapor deposition device according to claim 1, wherein the opening widths of the plurality of types of through holes that are in communication in the normal line direction of the substrate increase from the vapor deposition source opening side to the vapor deposition mask side.

3. The vapor deposition device according to claim 1, which is configured such that the vapor deposition particles discharged from the vapor deposition source opening adhere to only an inner circumferential surface of the through hole that is located nearest to the vapor deposition source opening among inner circumferential surfaces of the plurality of types of through holes that are in communication in the normal line direction of the substrate.

4. The vapor deposition device according to claim 1, wherein the plurality of types of through holes having different opening widths are disposed along a direction parallel to the second direction, in each of the plurality of plate members.

5. The vapor deposition device according to claim 1, wherein a portion of the plurality of plate members are positionally offset with respect to another portion in a direction orthogonal to the normal line direction of the substrate such that unevenness is formed on the inner circumferential surfaces of the plurality of limiting openings.

6. The vapor deposition device according to claim 5, wherein the plurality of plate members are positionally offset alternatively in opposite directions.

7. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 1.

8. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 1,
the vapor deposition method further comprising:
a step of removing a plate member that is located nearest to the vapor deposition source among the plurality of plate members and to which the vapor deposition particles have adhered; and
a step of adding a clean plate member to the limiting unit at a different position from the position of the removed plate member.

9. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 1,
the vapor deposition method further comprising a step of removing a plate member that is located nearest to the vapor deposition source among the plurality of plate members and of which the vapor deposition particles have adhered to only one side surface, turning over the plate member, and adding the plate member to the limiting unit at a different position from the position of the removed plate member.

10. The vapor deposition method according to claim 9, further comprising:
a step of removing a plate member that is located nearest to the vapor deposition source among the plurality of plate members and of which the vapor deposition particles have adhered to both side surfaces; and
a step of adding a clean plate member to the limiting unit at a different position from the position of the removed plate member.

11. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 1,
the vapor deposition method further comprising:
a step of removing a plate member that is located nearest to the vapor deposition source among the plurality of plate members and to which the vapor deposition particles have adhered, and adding a plate member to the limiting unit at a different position from the position of the removed plate member; and
a step of moving one of the vapor deposition source opening and the limiting unit relative to the other along the second direction.

12. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 1,
the vapor deposition method further comprising a step of positionally offsetting a portion of the plurality of plate members with respect to another portion in a direction orthogonal to the normal line direction of the substrate such that unevenness is formed on the inner circumferential surfaces of the plurality of limiting openings.

13. A vapor deposition method comprising a vapor deposition step of forming a coating film having a predetermined pattern on a substrate by causing vapor deposition particles to adhere onto the substrate,
wherein the vapor deposition step is performed by using the vapor deposition device,
the vapor deposition device comprising:
a vapor deposition unit including a vapor deposition source having at least one vapor deposition source opening, a vapor deposition mask disposed between the at least one vapor deposition source opening and the substrate, and a limiting unit that is disposed between the at least one vapor deposition source opening and the vapor deposition mask and in which a plurality of limiting portions are disposed along a first direction that is orthogonal to a normal line direction of the substrate; and
a moving mechanism that moves one of the substrate and the vapor deposition unit relative to the other along a second direction that is orthogonal to the normal line direction of the substrate and the first direction, in a state in which the substrate and the vapor deposition mask are spaced apart at a fixed spacing,
the coating film is formed by causing vapor deposition particles discharged from the at least one vapor deposition source opening and passing through a plurality of limiting openings separated by the plurality of limiting portions and a plurality of mask openings formed in the vapor deposition mask to adhere onto the substrate, the limiting unit includes a plurality of plate members that are stacked on one another, the plurality of plate members are stacked in the first direction, each of the plurality of limiting portions includes the plurality of plate members stacked in the first direction, and the vapor deposition method further comprising:

a step of removing a pair of plate members that are the outermost layers to which the vapor deposition particles have adhered among the plurality of plate members constituting each of the plurality of limiting portions; and a step of inserting a pair of plate members that are overlaid on each other between the plurality of plate members.

* * * * *